US011393832B2

(12) United States Patent
Mennenga

(10) Patent No.: US 11,393,832 B2
(45) Date of Patent: Jul. 19, 2022

(54) MEMORY CELL ARRANGEMENT

(71) Applicant: Ferroelectric Memory GmbH, Dresden (DE)

(72) Inventor: Menno Mennenga, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/929,666

(22) Filed: Jul. 15, 2020

(65) Prior Publication Data

US 2021/0091097 A1    Mar. 25, 2021

(51) Int. Cl.
*H01L 27/11507* (2017.01)
*H01L 49/02* (2006.01)
*H01L 27/11514* (2017.01)
*H01L 27/11502* (2017.01)

(52) U.S. Cl.
CPC .. *H01L 27/11507* (2013.01); *H01L 27/11502* (2013.01); *H01L 27/11514* (2013.01); *H01L 28/55* (2013.01); *H01L 28/60* (2013.01)

(58) Field of Classification Search
CPC ......... H01L 27/11502; H01L 27/11507; H01L 27/11514; H01L 28/55; H01L 28/60
See application file for complete search history.

(56) References Cited

U.S. PATENT DOCUMENTS

| 6,982,453 B2 | 1/2006 | Kanaya |
| 8,829,646 B2 | 9/2014 | Lung |
| 10,262,730 B1 * | 4/2019 | Nardi ................. G11C 13/0097 |
| 2002/0089871 A1 | 7/2002 | Jeon |
| 2009/0034162 A1 | 2/2009 | Yawata |
| 2011/0278527 A1 * | 11/2011 | Ishibashi ............. H01L 23/5226 257/1 |
| 2012/0032249 A1 | 2/2012 | Matsuda |
| 2013/0032874 A1 | 2/2013 | Ko |
| 2014/0198553 A1 | 7/2014 | Lung |
| 2015/0261437 A1 * | 9/2015 | Lee ........................ H01L 23/528 710/5 |
| 2017/0352671 A1 | 12/2017 | Kato |
| 2019/0088871 A1 * | 3/2019 | Kim .................... H01L 27/2409 |

(Continued)

OTHER PUBLICATIONS

Li et al., "Selector-free Hafnium-Zirconium Oxide Ferroelectric Memory and Application in NVSRAM", 2018 IEEE International Electron Devices Meeting (IEDM). Dated Aug. 3, 2018, 4 pages.

(Continued)

*Primary Examiner* — Matthew E Warren
(74) *Attorney, Agent, or Firm* — Hickman Becker Bingham Ledesma LLP; Malgorzata A. Kulczycka

(57) ABSTRACT

According to various aspects, a memory cell arrangement includes: a first control line and a second control line; a plurality of memory structures disposed between the first control line and the second control line, wherein each memory structure of the plurality of memory structures comprises a third control line, a first memory cell and a second memory cell; wherein, for each memory structure of the plurality of memory structures, the first memory cell and the second memory cell are coupled to each other by the third control line; wherein, for each memory structure of the plurality of memory structures, the first memory cell is coupled to the first control line and the second memory cell is coupled to the second control line.

20 Claims, 12 Drawing Sheets

(56) References Cited

U.S. PATENT DOCUMENTS

| | | | |
|---|---|---|---|
| 2019/0221612 A1* | 7/2019 | Kim | H01L 45/08 |
| 2019/0393167 A1 | 12/2019 | Bedeschi et al. | |
| 2020/0194431 A1* | 6/2020 | Castro | H01L 27/249 |
| 2020/0235050 A1 | 7/2020 | Lee | |
| 2021/0082958 A1 | 3/2021 | Mennenga | |
| 2021/0090662 A1 | 3/2021 | Mennenga | |
| 2022/0020776 A1 | 1/2022 | Mennenga et al. | |

OTHER PUBLICATIONS

Hou et all, "Investigation for the Feasibility of High-Mobility Channel in 3D NAND Memory", ECS Journal of Solid State Science and Technology, dated 2018, 6 pages.

Buck, Dudley, "Ferroelectrics for Digital Information Storage and Switching", Digital Computer Laboratory Massachusetts Institute of Technology, dated Jun. 5, 1952, 72 pages.

Mennenga, U.S. Appl. No. 16/929,685, filed Jul. 15, 2020, Restriction Requirement, dated Sep. 16, 2021.

Mennenga, U.S. Appl. No. 16/929,685, filed Jul. 15, 2020, Non-Final Rejection, dated Nov. 26, 2021.

Mennenga, U.S. Appl. No. 16/929,660, filed Jul. 15, 2020, Notice of Allowance, dated Apr. 23, 2021.

Mennenga, U.S. Appl. No. 16/929,660, filed Jul. 15, 2020, Office Action, dated Feb. 19, 2021.

Mennenga, U.S. Appl. No. 16/929,685, filed Jul. 15, 2020, Notice of Allowance and Fees Due, dated Jan. 7, 2022.

\* cited by examiner

FIG. 1
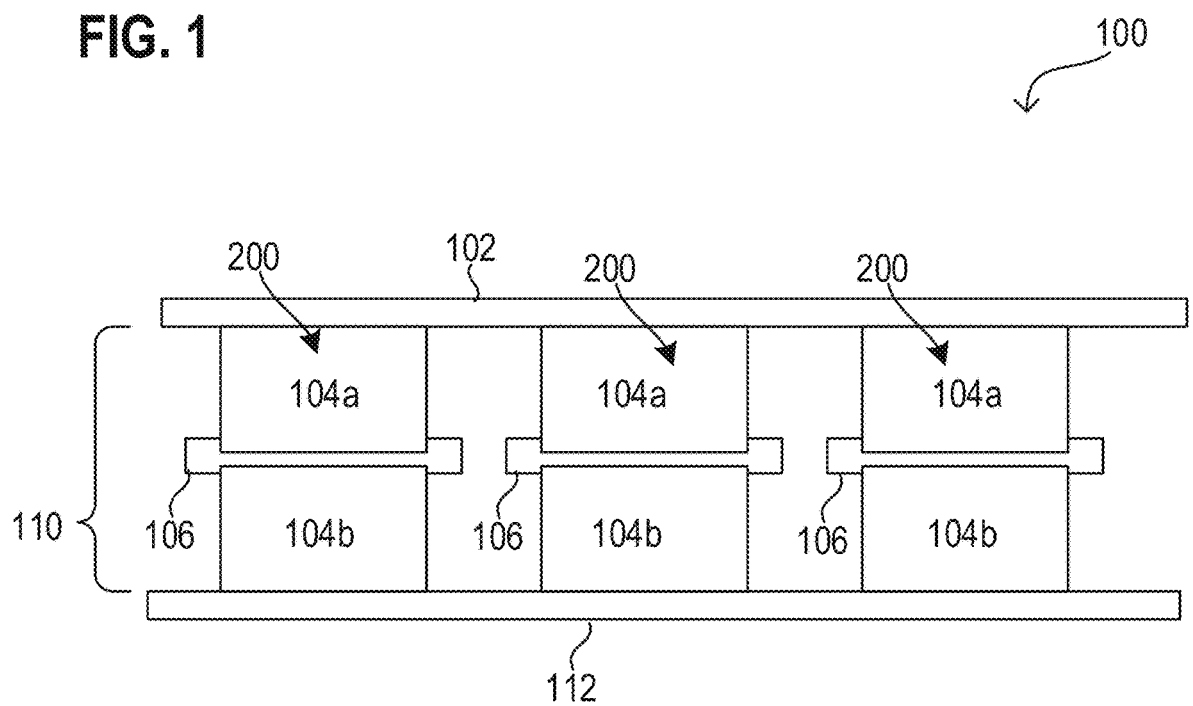
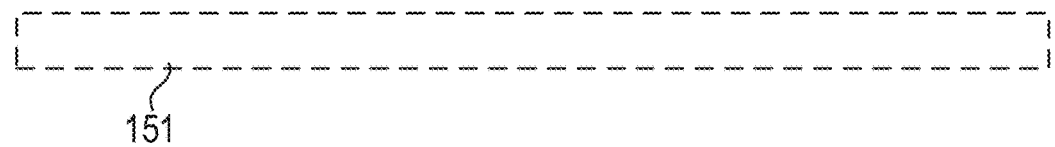
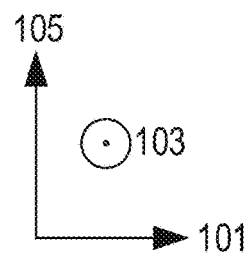

FIG. 3
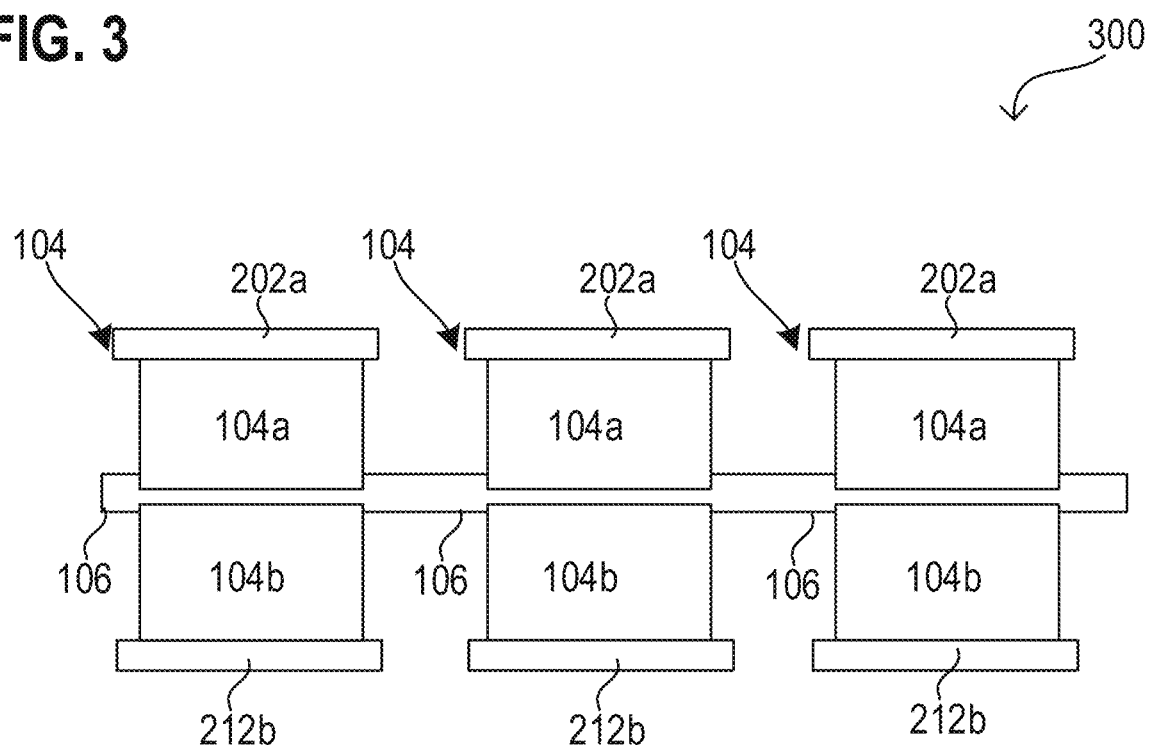
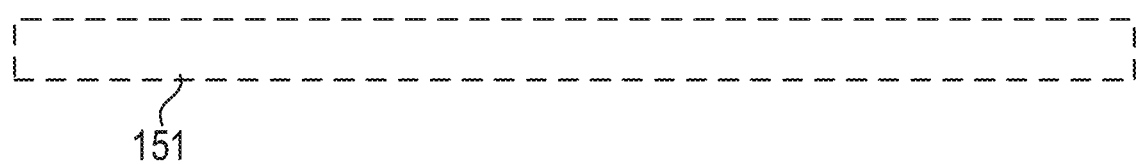
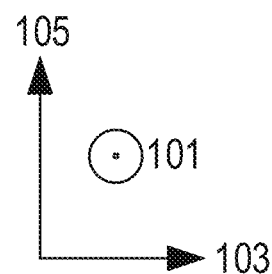

FIG. 4
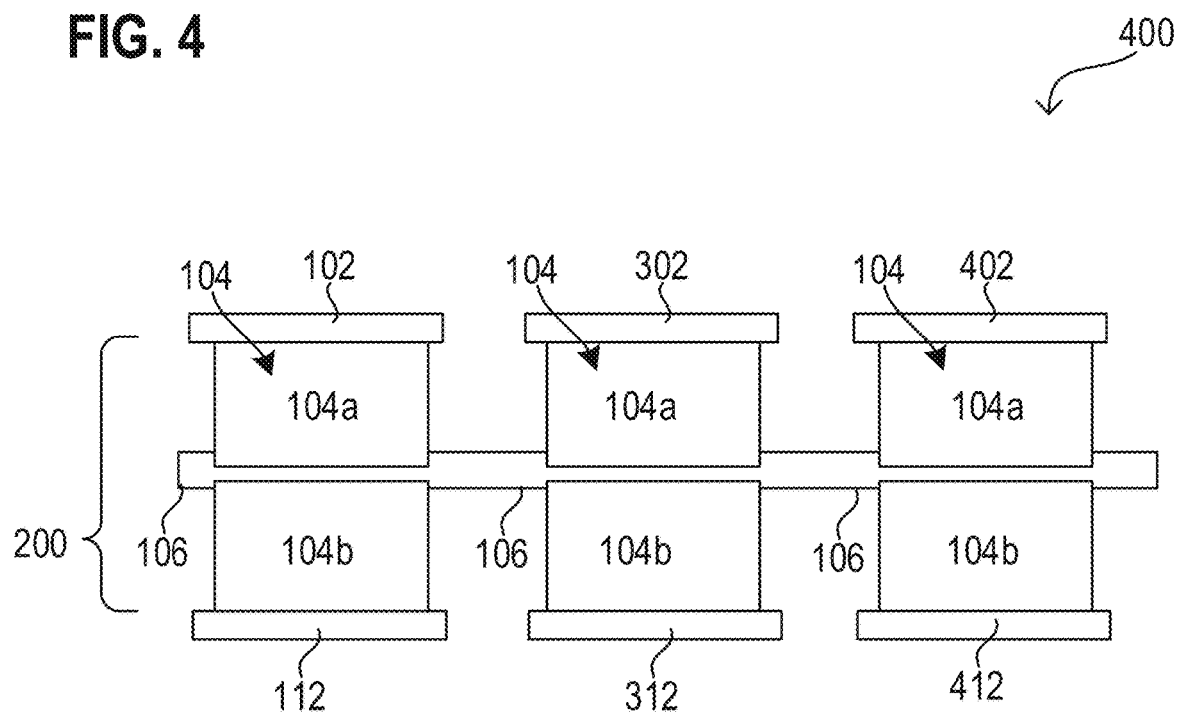
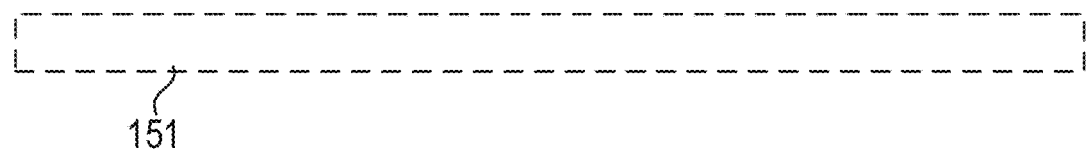
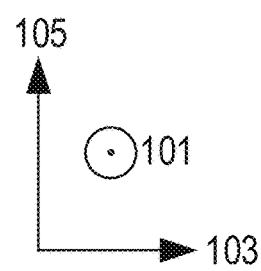

FIG. 5
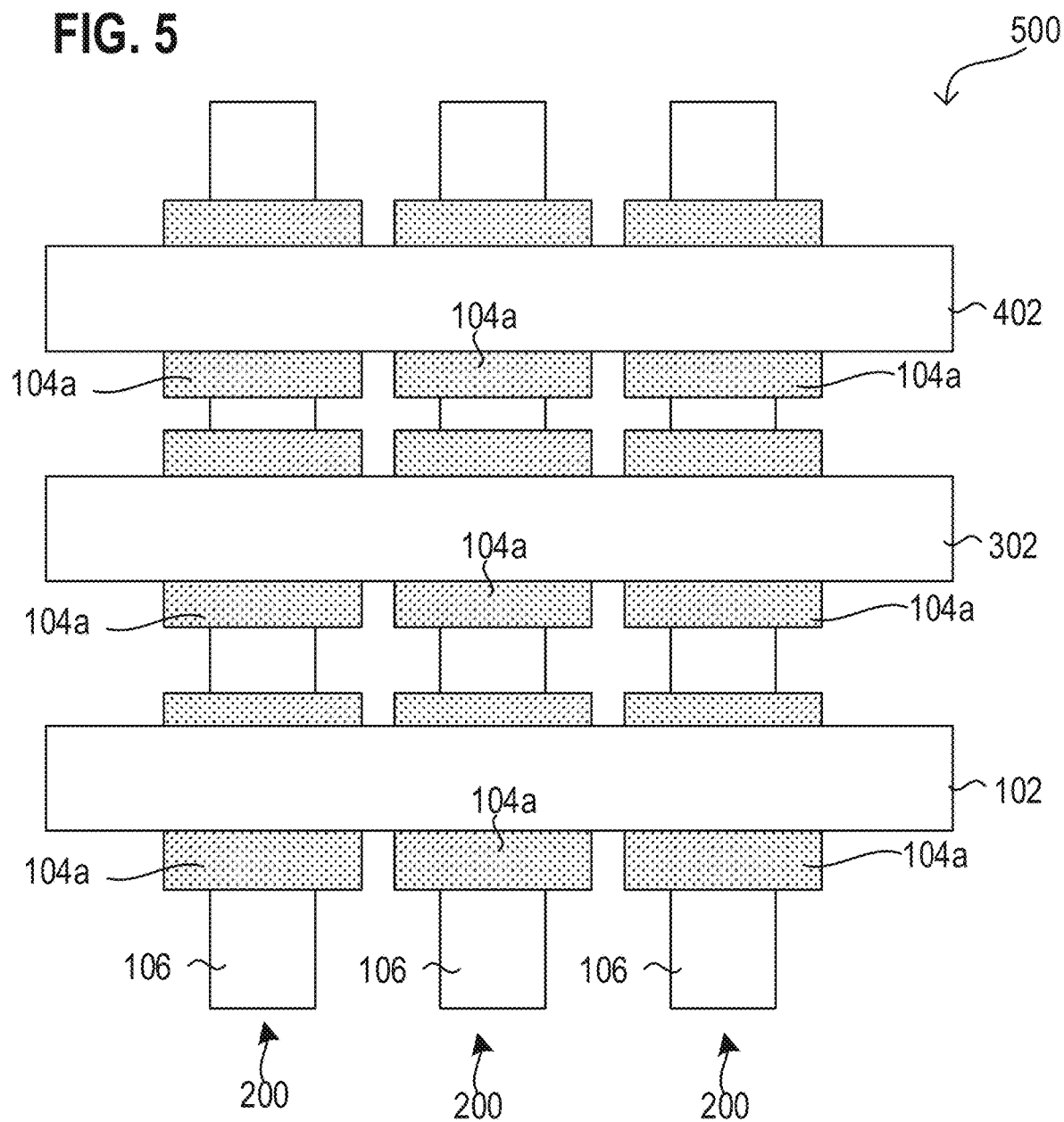
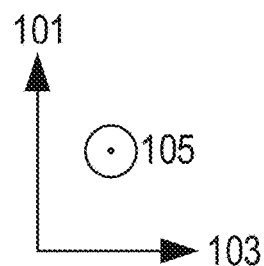

FIG. 8
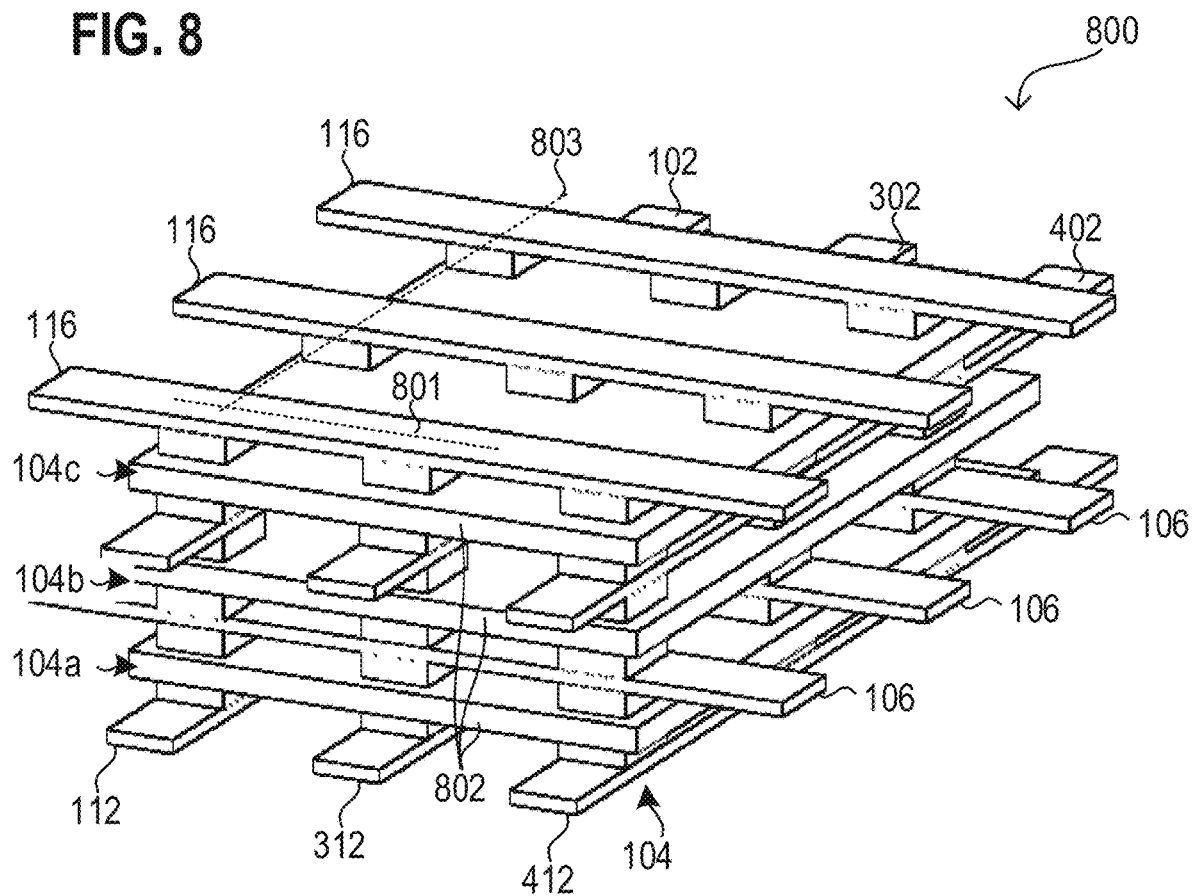
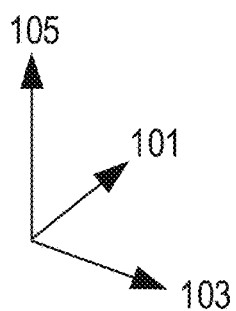

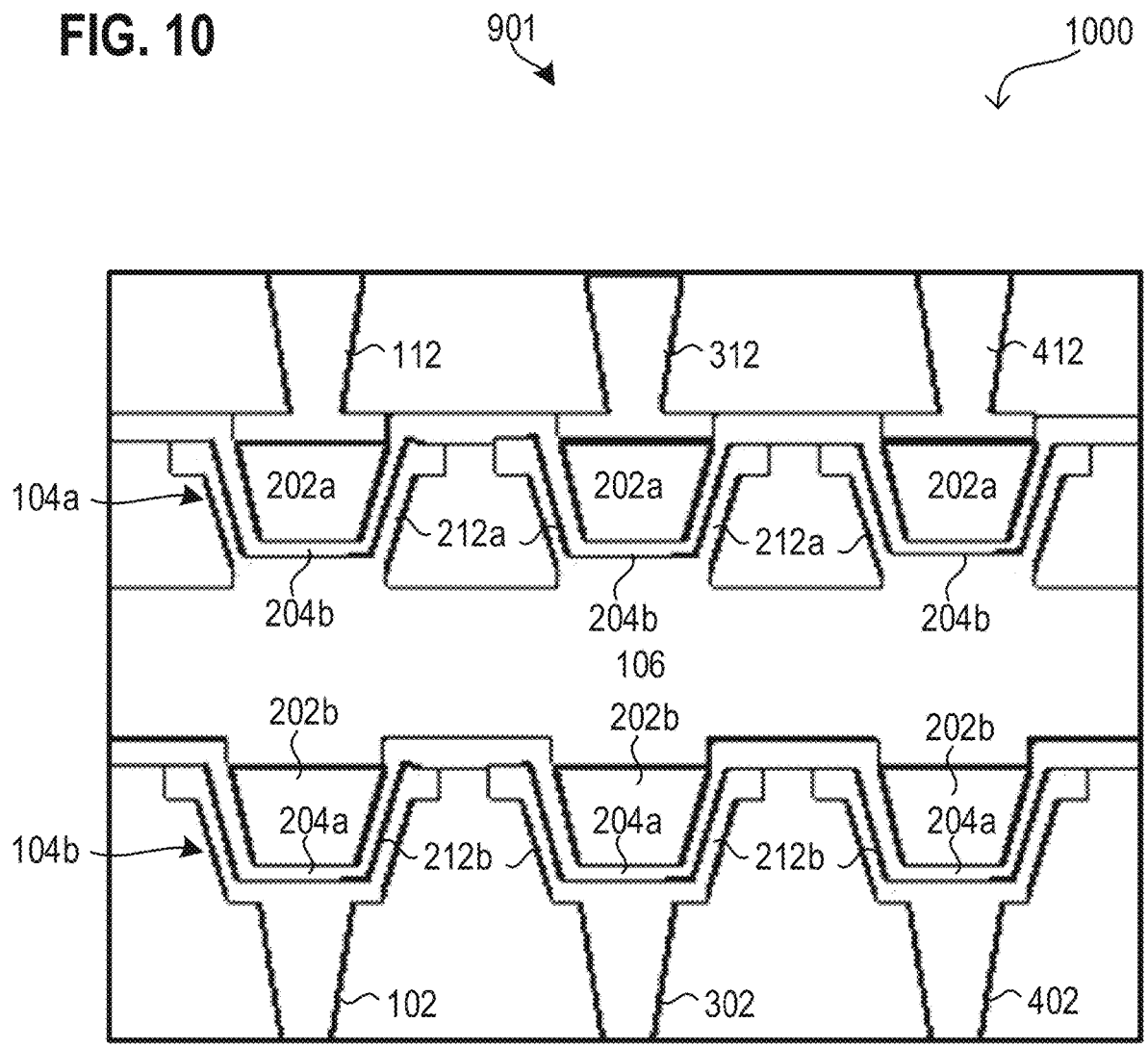

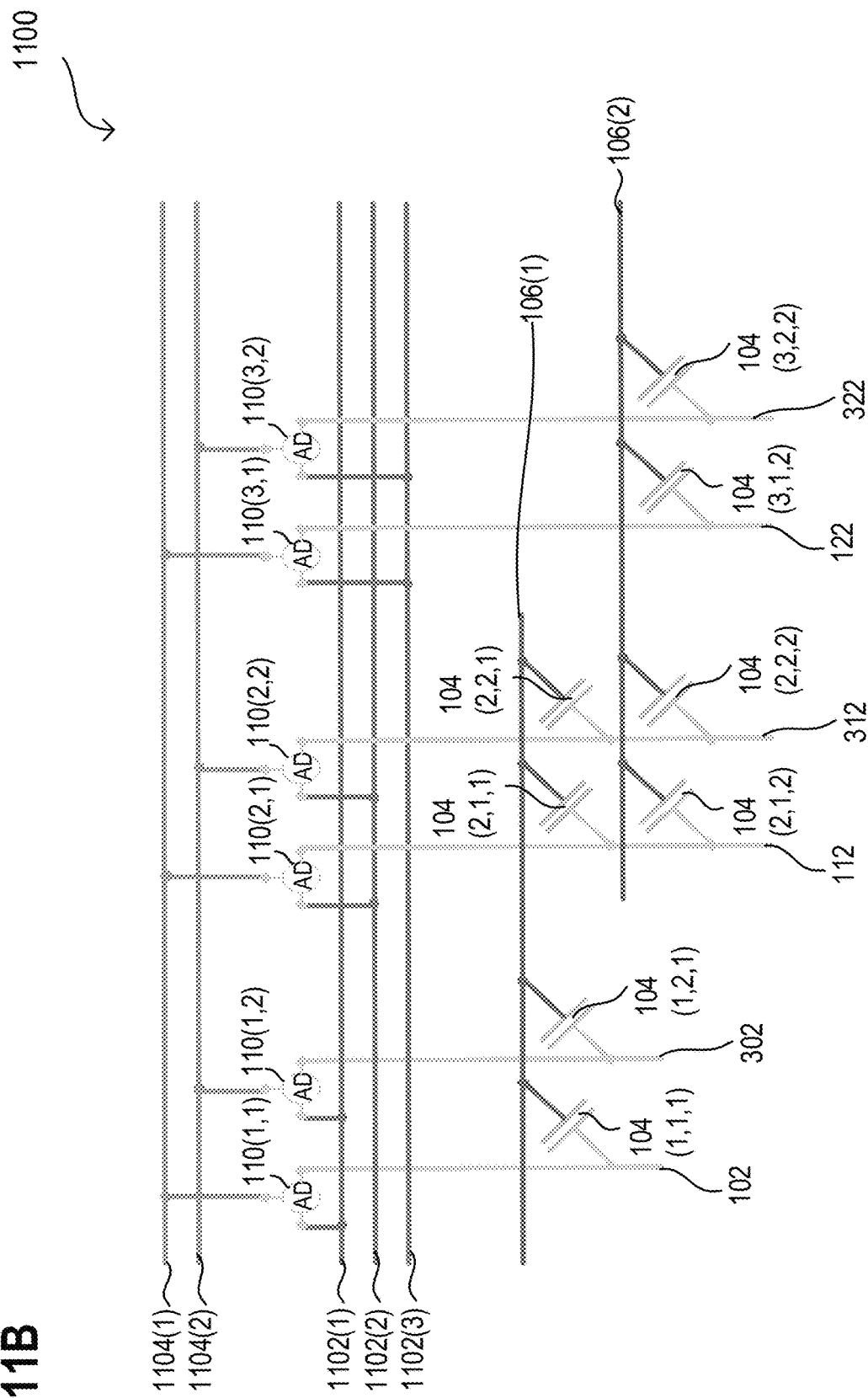

MEMORY CELL ARRANGEMENT

TECHNICAL FIELD

Various aspects relate to a memory cell arrangement and methods thereof, e.g., a method for forming a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 1 schematically shows a memory cell arrangement, according to various aspects;

FIG. 4 to FIG. 8 and FIG. 10 respectively schematically shows a memory cell arrangement, according to various aspects, e.g. based on the memory cell arrangement of FIG. 1;

FIG. 2 and FIG. 3 respectively schematically show a memory structure, according to various aspects, e.g. as present in the memory cell arrangement of one of FIG. 1, FIG. 4 to FIG. 8, and FIG. 10;

FIG. 11B schematically shows an exemplary memory cell arrangement, according to various aspects.

DESCRIPTION

Figure 2:
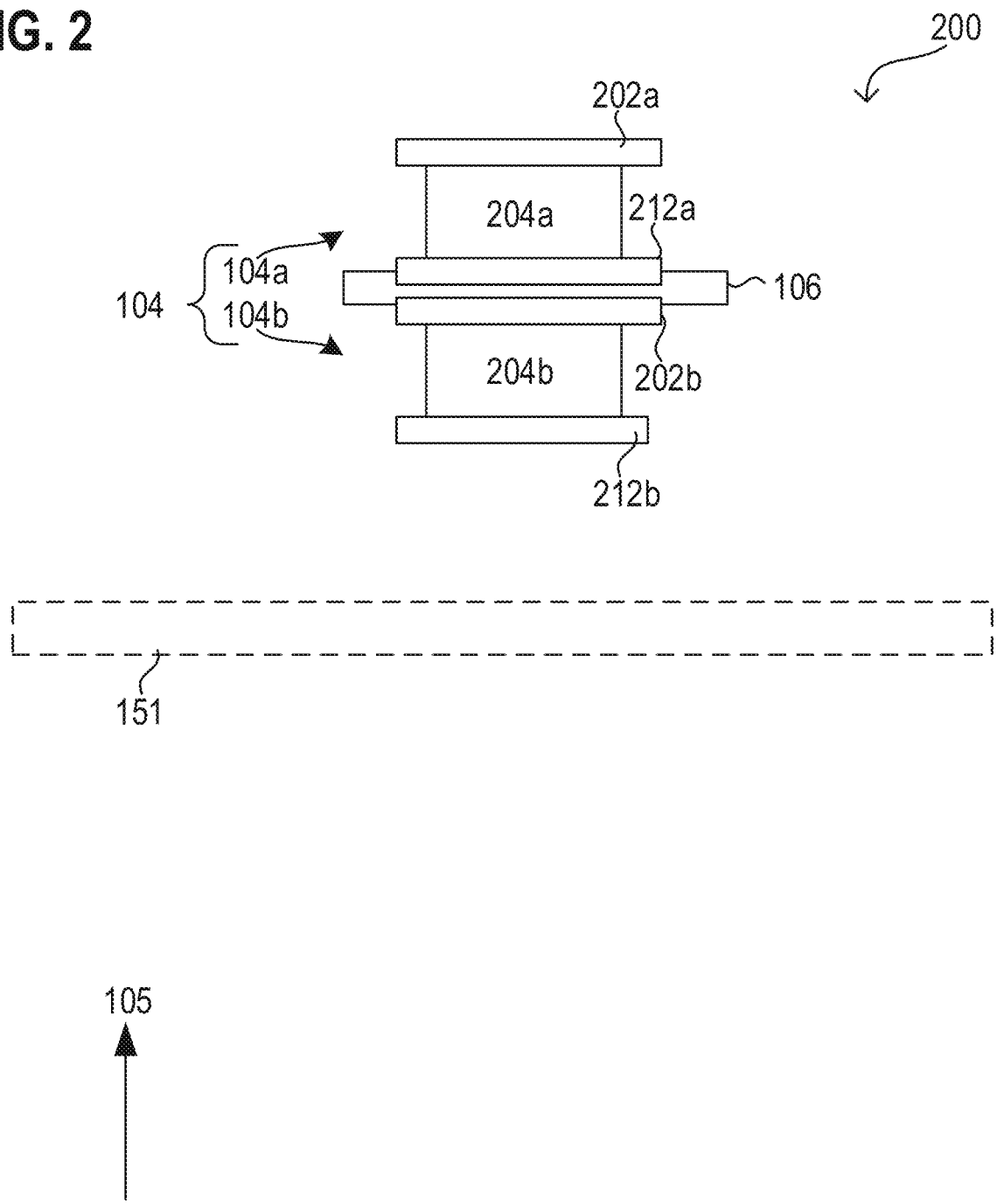

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "coupled" may be used herein with respect to nodes, integrated circuit elements, and the like, to mean a, e.g. direct or indirect, connection and/or interaction. Several elements may, for example, be coupled together along an interaction chain (e.g., an electrically conductive path), along which the interaction (e.g., electrical charges) may be transmitted. For example, two elements coupled together may exchange an interaction with each other, e.g. an electrical interaction (e.g., a current).

The term "connected" or "connection" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected."

The term "voltage" may be used herein with respect to one or more circuit elements, such as one or more passive circuit elements and/or or one or more active circuit elements. Examples for passive circuit elements may include: a conductive line, e.g. a bit line, a word line, a control line, a node, or a terminal. Examples for passive circuit elements may include: a memory cell, a switch (e.g., a transistor), and the like. For example, the voltage applied to a conductive line may represent the electrical potential of the conductive line (also referred to as voltage of the line). For example, the voltage applied to an active circuit element may refer to the electrical potential supplied to the active circuit element, e.g. its input. A voltage drop of a circuit element may refer to the voltage difference between the input/output of the circuit element.

As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line (for example a "word line voltage" may be provided to a "word line", a "bit line voltage" may be provided to a bit line).

Illustratively, a voltage provided to a line, node or a terminal may assume any suitable value depending on the intended operation of the circuit including the node or terminal. For example, a bit line voltage (referred to as $V_{BL}$) may be varied depending on the intended operation of the memory cell arrangement. Analogously, a word line voltage (referred to as $V_{WL}$) may be varied depending on the intended operation of a memory cell arrangement. A voltage provided to a node or terminal may be defined by the respective potential applied to that node or terminal relative to the base voltage (referred to as Vs) of the circuit. Further, a voltage drop associated with two distinct nodes or terminals of a circuit may be defined by the respective voltages/potentials applied at the two nodes or terminals. As an example, a voltage drop associated with a memory cell may be defined by the respective voltages/potentials applied at the corresponding memory cell (e.g., the electrodes of the memory cell).

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

For a facilitated understanding, reference is made to the terms "top" and "bottom" with respect to the memory cells, e.g., irrespective of the actual orientation of the memory cells, e.g. their architecture and/or the architecture including the memory cells. For example, a pair of memory cells may include a "top memory cell" and a "bottom memory cell." Said more generally, the terms "top" and "bottom" used herein may but do not need to indicate the actual spatial orientation of the memory cell. Regarding a substrate, the term "bottom" may indicate a smaller distance from the substrate than the term "top." As example, the substrate may be thicker than any other layer over the substrate.

According to various aspects, a memory cell may be addressable, e.g. by being unambiguously assigned to an address. The addressability may be provided by the architecture of the control lines connected to the memory cell. The address of the memory cell may represent the identity of the control lines connected to the memory cell. For example, the address of the memory cell may be stored by a corresponding write control circuit, e.g. using a look up table or the like. For example, the architecture of the control lines may be configured such that only one conduction path from the write control circuit to the memory cell and back to the write control circuit exists. The write control circuit may be configured to access the memory cell, e.g. to write to and/or read from the memory cell. Therefore, the write control circuit may be configured to generate and/or control the respective voltage values, voltage drops and/or voltages/potentials supplied to the memory cell.

According to various aspects, a memory cell may provide at least two distinct states (also referred to as memory states) associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, a remanent-polarizable memory cell, a capacitor or capacitor-based memory cell, and/or a ferroelectric-capacitor or ferroelectric-capacitor-based memory cell ("FeCAP"). A memory cell may be in a first memory state or in a second memory state. In some aspects, the memory state, in which a memory cell is residing in may influence a current characteristic and/or voltage characteristic during readout of the memory cell. The first memory state may be, for example, associated with a logic "1" and the second memory state may be, for example, associated with a logic "0" or vice versa. The definition of the memory states and/or the definition of a logic "0" and a logic "1" may be selected arbitrarily. The portion of the memory cell changing its state (e.g., chemical phase, conductivity, magnetic phase and/or polarization, electrical phase and/or polarization, etc.) in accordance with the memory states may be also referred to as active portion of the memory cell. The active portion (also referred to as memory portion or memory material portion) of the memory cell may be dielectric.

For example, a phase-change memory cell may include a phase change portion as active portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a remanent-polarizable memory cell may include a remanently-polarizable portion (also referred to as remanent-polarizable portion) as active portion. The remanent-polarizable portion may be used to implement memory functions, e.g., in a memory cell. Therefore, according to various aspects, a memory cell may be implemented as a capacitor structure, e.g., as a remanent-polarizable capacitor (also referred to as ferroelectric capacitor—"FeCAP"). In general, a remanent polarization (also referred to as retentivity or remanence) may be present in a material portion (e.g., a material layer) in the case that the material (also referred to as active material) may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

The remanent-polarizable portion may include or be formed from a remanent-polarizable material. The remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure and/or discharging current during discharging the capacitor structure.

In a capacitor structure, the amount of charge stored therein may be used to sense a memory state. For example, a first amount of charge stored in the capacitor structure may represent a first memory state and the second amount of charge stored in the capacitor structure may represent the second memory state.

In some aspects, a memory cell arrangement (e.g., an array including a plurality of memory cells) may be operated based on one or more write operations (e.g., program and/or erase operations) and/or one or more readout operations. According to various aspects, the write operation may include writing a memory cell (that is performing a write operation of a memory cell). The write operation may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state." For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state." For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily.

During a write operation, as example, predefined voltages may be provided to control lines (also referred to as driver-lines), wherein the control lines may be connected to the respective nodes (e.g., respective electrodes) of the memory cells to allow for the desired operation. The control lines may be referred to, for example, as bit lines or word lines. All memory cells that are not intended to be written may be supplied by a voltage drop that is at least less than the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages. The programming voltage may be applied to program, to erase, and/or to read out a respective memory cell. The programming voltage may be supplied via a voltage drop. The voltage drop may be supplied by supplying a first voltage to a first electrode (top electrode or bottom electrode) of a memory cell and by supplying a second voltage to a second electrode (bottom electrode or top electrode) of the memory cell. The voltage drop may be defined as a difference between the first voltage and the second voltage.

The terms "switch" in context with a memory cell may be used herein to describe a modification of the memory state a memory cell is residing in (that is a change of the memory state). For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell ("FeCAP") may include a capacitor structure including a ferroelectric material providing a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In general, a memory cell arrangement may include a plurality of (e.g., volatile or non-volatile) memory cells, which may be accessed individually or on groups via a corresponding addressing scheme. The matrix architecture may be, for example, referred to as "NOR" or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a write control circuit may be configured to carry out and/or instruct one or more write operations associated with a writing of one or more memory cells of the memory cell arrangement. In some aspects, a write control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include one or more of memory cell sets (also referred to as sets of memory cells). Each memory cell set of the plurality of memory cell sets may include a plurality of memory cells.

Herein the term "memory structure" refers to an assembly including one or more pairs of memory cells and one control line. Each pair of memory cells may include one memory cell of a first memory cell set (also referred to as first memory cell) and one memory cell of a second memory cell set (also referred to as second memory cell). The memory cells of each pair of memory cells may be disposed over each other (also referred to as stacked), e.g. regarding a substrate. Each memory cell of the memory structure may be connected (e.g., ohmically, e.g. by direct contact) to the control line of the memory structure (also referred to as word line), thus sharing the same word line. For example, each memory cell of the memory structure may physically contact the word line of the memory structure. Said otherwise, the memory cells of the memory structure may be connected to each other by the word line of the memory structure (analogously to a star topology). Thus, the memory cells of the memory structure may be supplied at least by the voltage of the word line.

As example, a vertical extension of the substrate may be more than a vertical extension of the memory structure. Additionally or alternatively, the substrate may be made from the same material, e.g. a semiconductor material.

Each electrode of the capacitor structure may be connected to a respective control line. It may be understood that an electrode may be, for example, at least partially integrated into the control line or may be, for example, separate from the control line. The electrode integrated into the control line may, for example, be provided by a portion of the material of the control line. For example, the electrode integrated into the control line may be formed from the same layer and/or material as the control line. The electrode separated from the control line may be, for example, provided by another material or layer than the control line.

Herein the term "between" may be used with respect to a spatial position of elements. A first element disposed between two second elements may be understood that at least one portion of the first element is disposed between the two second elements. For example, the first element may extend in (e.g., within, into or through) the space between the two second elements. For example, a linear path connecting the two second elements may contact the first element or extend through the first element.

In the following, various aspects of memory cell containing architectures are detailed, e.g. providing a memory structure and memory cell arrangement. The architectures according to various aspects facilitate the manufacturing process, e.g. for predefined target specifications of the result of the manufacturing process. By example, providing a high density of memory cells may be facilitated. Additionally or alternatively, providing a low signal to noise ratio (also referred to as S/N-ratio) may be facilitated. Illustratively, the density of memory cells and the S/N-ratio are counteracting specifications. Commonly, increasing the density of memory cells requires smaller memory cells, which results in a smaller output per memory cell, and thus, reduces the S/N-ratio. Traditionally, this counteraction is reduced by more complex manufacturing processes, thus increasing the effort and costs of the manufacturing process.

The architecture according to various aspects reduces this counteraction at a low manufacturing effort, such that a higher S/N-ratio may be obtained at constant density of memory cells and/or a higher density of memory cells may be obtained at constant S/N-ratio. For example, a simplified lithography reduces the effort and/or a reduced variability per memory cell increases the S/N-ratio. For example, the number of memory cells per control layer may be increased, which saves space and, thus, increases the density of memory cells. Additionally or alternatively, the active area per memory cell is increased, which increases the S/N-ratio and/or allows a smaller memory cell for a given the S/N-ratio.

The architecture according to various aspects includes a stack of layers made from ferroelectric hafnium oxide, which may but does not necessarily need to be structured. The ferroelectric hafnium oxide may be disposed between (illustratively, sandwiched) non-active (e.g., non-ferroelectric) dielectric material, e.g., $SiO_2$, and a grid of structured top and bottom electrodes embedded therein. Each layer of hafnium oxide may be interspersed by two (e.g., metallic) interconnect layers. Each interconnect layer may include a plurality of in-plane-parallel (e.g., metallic) control lines, wherein the control lines of successive interconnect layers are rotated by 90° relative to each other. Each control line may be connected to one or more bottom electrodes disposed over or in the interconnect layer and one or more top electrodes disposed under or in the interconnect layer, wherein the electrodes (e.g., electrically and/or physically) contact the hafnium oxide.

Optionally, the hafnium oxide may be deposited in one or more recesses (illustratively providing cavities) that electrically contact the control line, e.g. by the respective electrode, which increase the electrically active area between top and bottom electrodes, while the vertically projected area is minimized.

Hafnium oxide may be understood as exemplarily active material. Additionally or alternatively to hafnium oxide, one or more other types of active material may be used. The references made to hafnium oxide as active material may analogously apply to the one or more other types of active material.

Analogously, a metal may be understood as exemplarily electrically conductive material (e.g., having an electrical conductivity of more than $10^4$ Siemens per meter or than $10^6$ Siemens per meter). Additionally or alternatively to the metal, one or more other types of electrically conductive material may be used, for example, a metal nitride. The references made to metal as electrically conductive material may analogously apply to the one or more other types of electrically conductive material, e.g. copper, a metallic compound, titanium nitride, or graphene.

Analogously, an oxide (e.g., $SiO_2$) may be understood as exemplarily dielectric material (e.g., having an electrical conductivity of less than $10^{-4}$ Siemens per meter or than $10^{-6}$ Siemens per meter). The references made to the oxide (e.g., $SiO_2$) as dielectric material may analogously apply to the one or more other types of dielectric material, for example, to silicon nitride, to aluminum oxide, to hafnium oxide.

FIG. 1 illustrates a memory cell arrangement 100 according to various aspects in a schematic side view or cross-sectional view. The memory cell arrangement 100 includes a first control line 102 (also referred to as top bit line) and a second control line 112 (also referred to as bottom bit line), and a plurality 110 of memory structures disposed between the first control line 102 and the second control line 108. For example, the plurality 110 of memory structures may include two memory structures 110a, 110b or more, e.g. three memory structures 200 or more. Generally, the number of memory structures 200 of the plurality 110 of memory structures 200 may be 2 or more, e.g. three or more, e.g. five or more, e.g. ten or more, e.g. 20 or more, e.g. 40 or more, e.g. 50 or more, e.g. 100 or more, e.g. 1000 or more.

For a facilitated understanding, reference is made to one memory structure 200 of the plurality 110 of memory structures as representative for each of the memory structures 200. It may be understood that the references made to the memory structure 200 may analogously apply to each memory structure 200 of the plurality 110 of memory structures. The memory structure 200 may include one or more pairs of memory cells 104a, 104b (also referred to as double cell), of which the first double cell 104 is depicted.

Each double cell 104 may include a first memory cell 104a (also referred to as top memory cell 104a) and a second memory cell 104b (also referred to as bottom memory cell 104b). Said otherwise, each memory structure of the plurality 110 of memory structures may include one or more top memory cells 104a and one or more bottom memory cells 104a.

For a facilitated understanding, reference is made to one double cell 104 of the memory structure 200 as representative for other double cells 104. It may be understood that the references made to the double cell 104 may analogously apply to each double cell 104 of the memory structure 200.

The memory structure 200 may include a third control line 106 (also referred to as word line 106) coupling the top memory cell 104a with the bottom memory cell 104b. Further, the top memory cell 104a (e.g., its top electrode) may be coupled to the top bit line 102. The second memory cell 104b (e.g., its bottom electrode) may be coupled to the bottom bit line 112.

Optionally, the memory cell arrangement 100 may include a substrate 151, over which the control lines 112, 106, 102 are stacked over each other (along direction 105). Direction 105 may be directed away from the substrate 151.

The top memory cells 104a of the memory structure 200 may be part of a first set of memory cells 104a (also referred to as set of first memory cells 104a) and the bottom memory cells 104b of the memory structure 200 may be part of a second set of memory cells 104b (also referred to as set of second memory cells 104a). The second set of memory cells 104b may be disposed between the substrate 152 and the first set of memory cells 104a.

FIG. 2 illustrates a memory structure 200 according to various aspects in a schematic side view or cross-sectional view, e.g. as contained the memory cell arrangement 100.

The memory structure 200 includes a first top electrode 202a and a first bottom electrode 212a. The memory structure 200 includes further a first active (e.g., ferroelectric) portion 204a disposed between first top electrode 202a and the first bottom electrode 212a. The first top electrode 202a, the first bottom electrode 212a and the first active portion 204a may provide a first capacitor structure as part of the top memory cell 104a.

The memory structure 200 includes a second top electrode 202b and a second bottom electrode 212b. The memory structure 200 includes further a second active (e.g., ferroelectric) portion 204b disposed between second top electrode 202b and the second bottom electrode 212b. The second top electrode 202b, the second bottom electrode 212b and the second active portion 204b may provide a second capacitor structure as part of the bottom memory cell 104b.

The first bottom electrode 212a and the second top electrode 202b are disposed between the first active portion 204a and the second active portion 204b and are coupled to each other by a word line portion, that is, by a portion of a word line 106. As outlined above, the first bottom electrode 212a and the second top electrode 202b may be at least partially integrated in the word line 106 or be separate from the word line 106.

FIG. 3 illustrates a memory structure 200 according to various aspects 300 in a schematic side view or cross-sectional view, e.g. configured as outlined above. The memory structure 200 may include a plurality of double cells 104. Each of the double cells 104 may include a first memory cell 104a and a second memory cell 104b. Each first memory cell 104a of the memory structure 200 and each second memory cell 104b of the memory structure 200 may each be coupled to the word line 106 of the memory structure 200.

For example, the memory structure 200 may include two or more double cells 104, e.g. three or more double cells 104. Generally, the number of double cells 104 per memory structure 200 may be two or more, e.g. three or more, e.g. five or more, e.g. ten or more, e.g. 20 or more, e.g. 40 or more, e.g. 50 or more, e.g. 100 or more, e.g. 1000 or more.

The double cells 104 of the memory structure 200 may be, for example, arranged in a row, e.g. along the extension of the word line 106.

FIG. 4 illustrates a memory cell arrangement according to various aspects 400 in a schematic side view or cross-sectional view. The memory cell arrangement 100 includes a plurality of first control lines 102, 302, 402, e.g. including the top bit line 102 and one or more further top bit lines 302, 402 (also referred to as top control lines or first control lines). The top bit lines of the plurality of first control lines 102, 302, 402 may differ from each other by top memory cell 104a of the memory structure 200, they are connected to. Additionally or alternatively, the top memory cells 104a of the memory structure 200 may differ from each other in the top bit line, they are connected to.

The memory cell arrangement 100 includes a plurality of second control lines 112, 312, 412, e.g. including the bottom bit line 112 and one or more further bottom bit lines 312, 412 (also referred to as bottom control lines or second control lines). The bottom bit lines of the plurality of second control lines 112, 312, 412 may differ from each other by bottom memory cell 104b of the memory structure 200, they are connected to. Additionally or alternatively, the bottom memory cells 104b of the memory structure 200 may differ from each other in the bottom bit line, they are connected to.

Said otherwise, each control line of the second control lines 112, 312, 412 and of the first control lines 102, 302, 402 contacts individually one memory cell 104a, 104b of the memory structure 200. Thus, each memory cell 104a, 104b of the memory structure 200 may be connected individually to one bit line either of the plurality of first control lines 102, 302, 402 or of the plurality of second control lines 112, 312, 412. This achieves, that each memory cell 104a, 104b of the memory structure 200 is individually addressable.

The memory structure 200 may be disposed between the plurality of first control lines 102, 302, 402 and the plurality of second control lines 112, 312, 412. Additionally or alternatively, the plurality of second control lines 112, 312, 412 may be disposed between the plurality of first control lines 102, 302, 402 and the substrate 151.

FIG. 5 illustrates a memory cell arrangement according to various aspects 500 in a schematic cross-sectional view, of the towards the substrate 151. The memory cell arrangement may include a first set of memory cells including a plurality of the top memory cells 104a. Each memory structure 200 may include one or more top memory cells 104a of the first set of memory cells.

Each memory structure 200 may include a first double cell 104 (including a first top memory cell 104a and a first bottom memory cell 104b) connected to the first bottom bit line 112 and/or the first top bit line 102. Each memory structure 200 may include one second double cell 104 (including a second top memory cell and a second bottom memory cell) connected to the second bottom bit line 312 and/or the second top bit line 302. Optionally, each memory structure 200 may include one third double cell 104 (including a third top memory cell and a third bottom memory cell) connected to the third bottom bit line 412 and/or the third top bit line 402.

Figure 6:
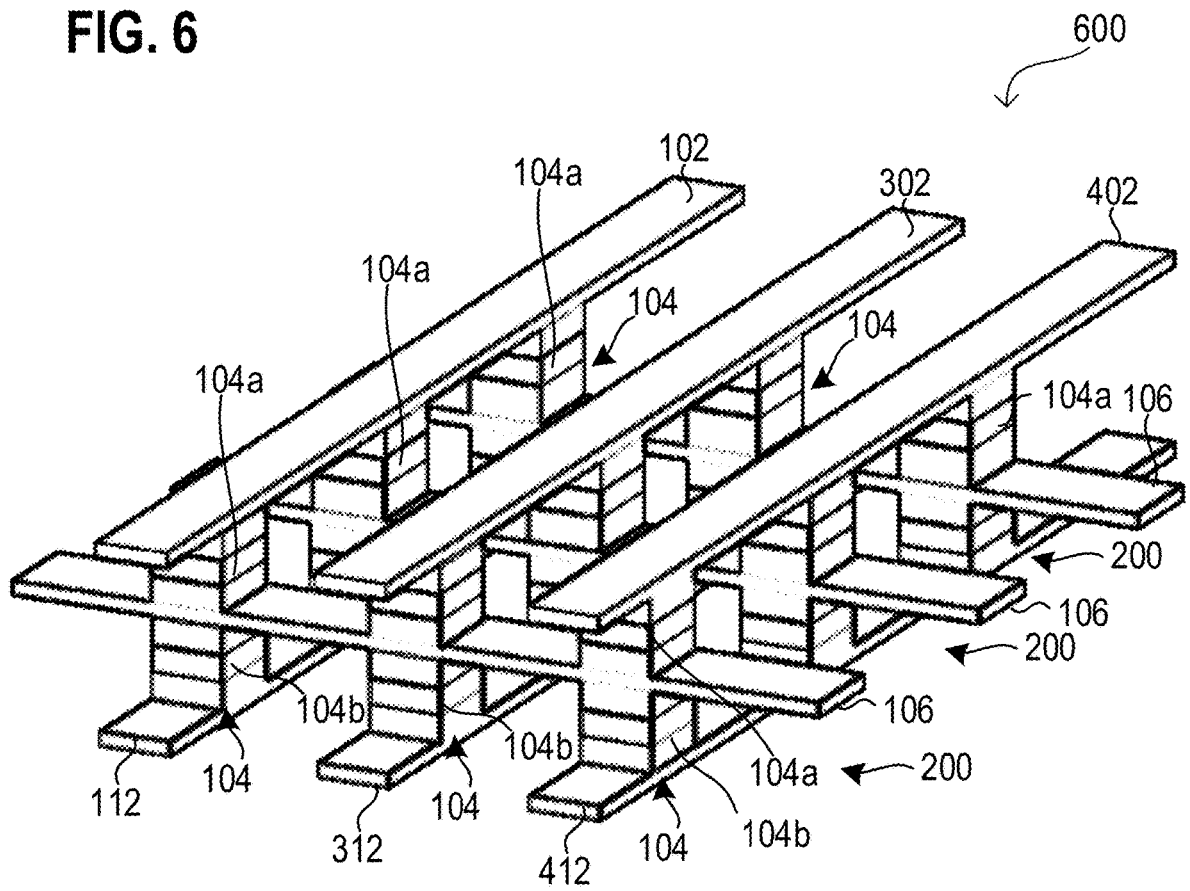

FIG. 6 illustrates a memory cell arrangement 100 according to various aspects 600 in a schematic perspective view. Each top bit line 102, 302, 402 and/or each bottom bit line 112, 312, 412 extend into a first direction 101. The third control line of each memory structure 200 extend into a second direction 103. The first direction 101 and the second direction 103 may differ from each other. For example, the first direction 101 and the second direction 103 may encompass an angle in the range from about 10° to about 90°, from about 45° to about 90°. For example, the first direction 101 and the second direction 103 may be substantially perpendicular to each other (that is, the angle is about 90°).

For example, the first direction 101 and the second direction 103 may be within a plane 101, 103. The plane 101, 103 and direction 105 may encompass an angle in the range from about 10° to about 90°, from about 45° to about 90°. For example, plane 101, 103 may be perpendicular to the direction 105.

Generally, the memory cell arrangement 100 may be formed by stacking layers one over another, e.g. on the substrate 151. For example, forming one or more bottom and/or top lines 102, 302, 402 may include forming a first layer (e.g., including or formed from an electrically conductive material, e.g. a metal) and structuring the first layer (also referred to as first interconnection layer). For example, forming one or more bottom bit lines 112, 312, 412 may include forming a second layer (e.g., including or formed from an electrically conductive material, e.g. a metal) over the first layer and structuring the second layer (also referred to as second interconnection layer). For example, forming one or more word lines 105 may include forming a third layer (e.g., including or formed from an electrically conductive material, e.g. a metal) between the second layer and the first layer and structuring the third layer (also referred to as third interconnection layer).

For example, forming one or more bottom memory cells 104b may include forming one or more first active layers (e.g., including or formed from an active material) between the first interconnection layer and the third interconnection layer and optionally structuring the one or more first active layers. For example, forming one or more top memory cells 104a may include forming one or more second active layers (e.g., including or formed from an active material) between the third interconnection layer and the first interconnection layer and optionally structuring the one or more second active layers. For example, the active material may include or be formed from (e.g., may consist of) a ferroelectric material.

As outlined above, forming each memory cell 104a, 104b may optionally include forming one or more electrodes, e.g. by forming and structuring one or more additional layers (also referred to as electrode layers) and/or by structuring the respective the interconnection layers. The one or more respective electrode layers may include or be formed from an electrically conductive material, e.g. including or formed from a metal and/or a nitride. The one or more respective electrode layers may differ from the first layer, the second layer, and/or the third layer in at least one of a material and/or an electrical conductivity.

Figure 7:
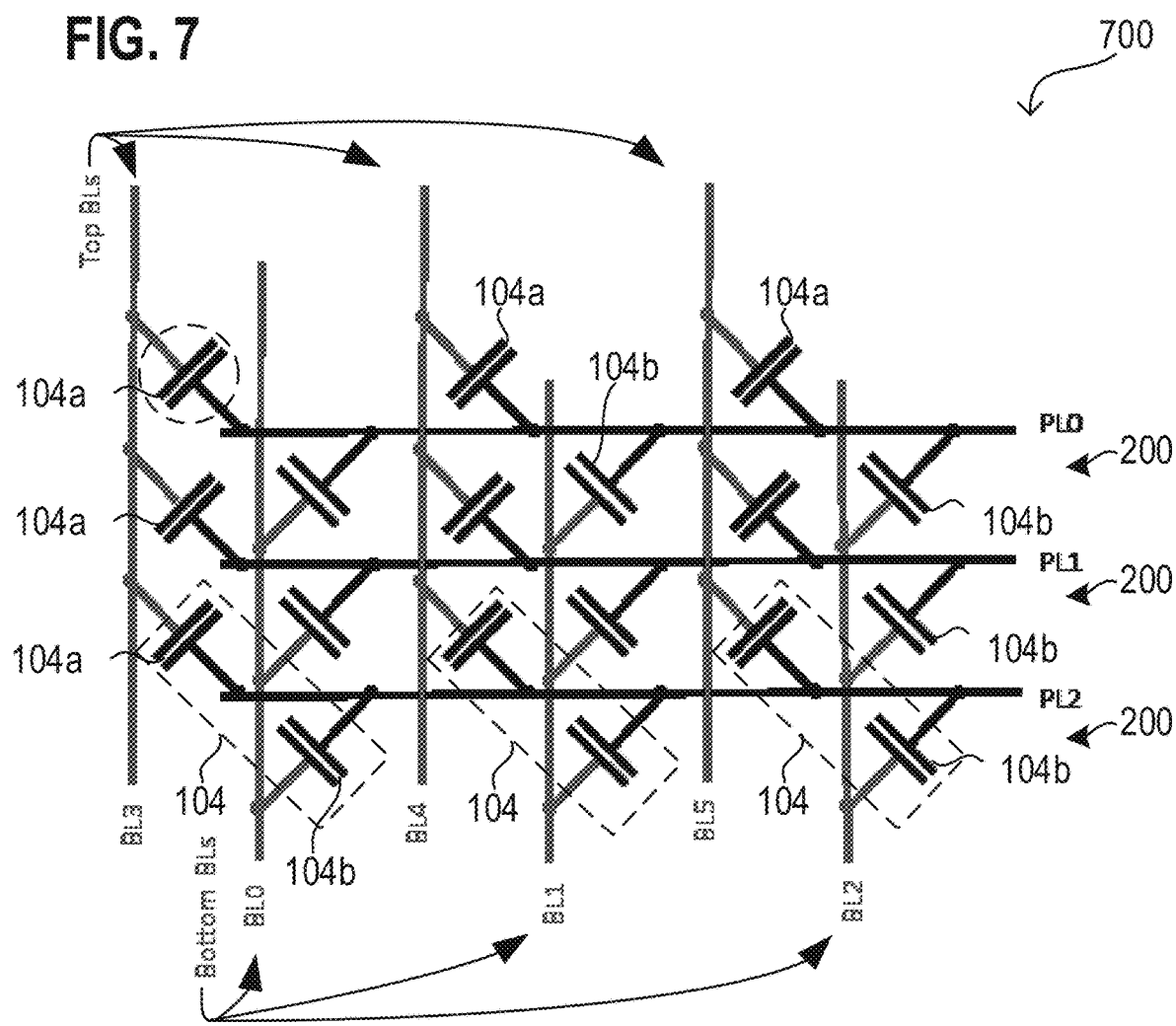

FIG. 7 illustrates a memory cell arrangement 100 according to various aspects 700 in a schematic circuit diagram. The word lines are referred to as PL0, PL1, PL2. The bottom bit lines (bottom BLs) are referred to as BL0, BL1, BL2. The top bit lines (top BLs) are referred to as BL3, BL4, BL5. Each first memory cell 104a and each second memory cell 104b is represented by a capacitor, that is, they provide a capacitance (e.g., a charge storage).

Operating the memory cell arrangement 100 may include applying a respective voltage (also referred to as operation voltage) to each of the control lines (together also referred to as control grid), e.g. each of the word lines PL0, PL1, PL2, each of the bottom bit lines BL0, BL1, BL2 and each of the top bit lines BL3, BL4, BL5. The time dependency of the individual operation voltages may be controlled by a write control circuit. The write control circuit may be configured to select one of the memory cells of the memory cell arrangement 100 (also referred to as selected memory cell), indicated in FIG. 7 by a dashed circle. The memory cell may be selected for certain time period (also referred to as accessing period). After expiration of the accessing period, another memory cell may be selected. As such, multiple memory cells may be selected one after each other (sequentially). For example, only one memory cell may be selected per accessing period.

Each memory cell 104a, 104b of the memory cell arrangement 100 may be individually addressable. Addressing may include that a selected memory cell may be accessed (e.g., written or read) without accessing another (e.g, without accessing any other) memory cell of the memory cell arrangement 100. In other words, the address of the selected memory cell may be unique and known to the write control circuit. In the following, reference is made to a writing operation as example, which includes to write a memory cell, for illustrative purposes. The references made to the writing operation may analogously apply to a reading operation.

The write control circuit may be configured to determine the address of the selected memory cell and to change one or more operation voltages applied to the plurality control lines, e.g. to one or more of the word lines, one or more of the bottom bit lines and/or one or more of the top bit lines. The change of the one or more operation voltages may be a function of the address of the selected memory cell.

For example, the selected memory cell (encircled by a dashed line) may be the top memory cell 104a of the first double cell 104 of the first memory structure 200. The first memory structure 200 may include a first word line PL0. The memory cells of the first memory structure 200 may be connected to the first word line PL0. The selected memory cell may be coupled between the first word line PL0 and a first top bit line BL3. As such, the tuple {PL0; BL3} represents the address of the selected memory cell (illustratively, being unique to the selected memory cell).

Writing the selected memory cell may include applying a voltage drop (also referred to as writing voltage) to the selected memory cell. For example, writing the selected memory cell may include supplying a first voltage to a first electrode (top electrode or bottom electrode) of the selected memory cell and supplying a second voltage to a second electrode (bottom electrode or top electrode) of the selected memory cell. The writing voltage may be in a writing voltage range. The absolute value of the difference between the first voltage and the second voltage may be referred to as programming voltage. The writing voltage range may be the range from the voltage (also referred to as programming voltage or switching voltage), at which the memory state of the memory cell is switched, to the maximum operation voltage of the memory cell. Below the programming voltage, the memory cell will maintain the current memory state.

Herein, the writing voltage may be $2 \cdot Vp$ or $-2 \cdot Vp$, depending on whether the memory state is to be a first memory state or a second memory state. For example, the first memory state may represent a logic "0" and the second memory state may represent a logic "1" or vice versa. Vp may be used here as an exemplarily voltage (also referred to as supply voltage) that is less than the programming voltage and more than half of the programming voltage. For example, the write control circuit may be supplied with the supply voltage Vp.

Applying the writing voltage to the selected memory cell may include to apply a first voltage $V_B$ (also referred to as bit voltage) to the first top bit line BL3, a second voltage $V_O$ (also referred to as inhibit voltage) to the first bottom bit line BL0, and a third voltage $V_W$ (also referred to as word voltage) to the first word line PL0. Applying the writing voltage to the selected memory cell may include to provide a voltage drop to the selected memory cell above the programming voltage. Said otherwise, the difference between the bit voltage $V_B$ and the word voltage $V_W$ applied to the selected memory cell may be more than the programming voltage.

For example, the writing voltage provided by the voltage drop may be $|V_B-V_W|=2 \cdot Vp$. For example, applying a writing voltage of $2 \cdot Vp$ to the selected memory cell may include to set $V_W=0 \cdot Vp$ (e.g., 0 Volt may be the base voltage) and $V_B=2 \cdot Vp$. For example, applying a writing voltage of $-2 \cdot Vp$ to the first bottom memory may include to apply $V_W=2 \cdot Vp$ and $V_B=0 \cdot Vp$.

The voltage drop (also referred to as sub-writing voltage) applied to all other (non-selected) memory cells of the memory cell arrangement 100 may be less than the programming voltage (also referred to as sub-writing voltage range), e.g. less than $2 \cdot Vp$, e.g. substantially 1 Vp. Applying the sub-writing voltage may include applying the inhibit voltage $V_O$ to all other bit lines and/or word lines connected to the first memory structure 200. The inhibit voltage $V_O$ may also The inhibit voltage $V_O$ may be the mean of the word voltage $V_W$ and the bit voltage $V_B$, that is $V_O=0.5 \, (V_B+V_W)$, but may be also another value. For example, the inhibit voltage $V_O$ may be substantially 1 Vp. This achieves that the difference between the inhibit voltage $V_O$ and the bit voltage $V_B$ and the difference between the inhibit voltage $V_O$ and the word voltage $V_W$ are both in the sub-writing voltage range, e.g. being substantially 1 Vp. Said otherwise, the maximum voltage drop applied to all non-selected memory cells does not exceed the sub-writing voltage range, e.g. does not exceed 1 Vp. This prevents an unintended write operation of one or more of the non-selected memory cells.

Performing the writing operation to another memory cell may be similar. For example, when the selected memory cell is the bottom memory cell 104b of the first double cell, applying the writing voltage to the selected memory cell may include to apply the bit voltage $V_B$ to the first bottom bit line BL0, the inhibit voltage $V_0$ to the first top bit line BL3, and the word voltage $V_W$ to the first word line PL0. Said more generally, applying the writing voltage to the selected memory cell may include applying the bit voltage $V_B$ and the word voltage $V_W$ to the control lines, to which the selected memory cell is connected, and applying the inhibit voltage $V_0$ to all other control lines of the memory cell arrangement 100.

Reading the selected memory cell may be similar to writing the selected memory cell. Reading the selected memory may include to perform the writing operation for the selected memory cell (e.g., to write a logic "0"), and sensing the current of the selected memory cell in response to the writing operation (also referred to as switching current). The writing operation may include to apply the writing voltage to the selected memory cell. The writing voltage may be assigned to a reference memory state (e.g., assigned to a logic "0"). The reference memory state may be the first memory state or the second memory state.

The switching current is output by the memory cell in response to switching the memory state. Thus, when a switching current is sensed, the memory cell switched to the reference memory state, and thus, had been in the other memory state before. When no switching current is sensed, the memory cell maintained the memory state, and thus, had been in the reference memory state before. Thus, sensing the switching current allows to determine the memory state at the point of time, the selected memory is read.

FIG. 8 illustrates a memory cell arrangement 100 according to various aspects 800 in a schematic perspective view. The memory cell arrangement 100, e.g. each of the memory structures 200, may include two or more sets of memory cells stacked over each other, e.g. the first set of memory cells 104a, the second set of memory cells 104b, and optionally, a third set of memory cells 104c. In case, the third set of memory cells 104c is present, each memory structure 200 may include two word lines 106, 116, e.g. a first word line 106 and a second word line 116. The second set of memory cells 104b and the third set of memory cells 104c may be disposed between the two word lines 106, 116. The top bit lines 102, 302, 402 may be disposed between the second set of memory cells 104b and the third set of memory cells 104c.

The memory cell arrangement 100 may include a plurality of active layers 802 (also referred to as memory layers or memory material layers). Each of the active layers 802 may provide one set of memory cells. The or each active layer 802 may include or be formed from an active material. The active material may be understood as being a switchable material, e.g. being a bi-stable material. Switching the active material may enable to switch between the first memory state and the second memory state. For example, the active material may include or be formed from a ferroelectric material.

For example, a first active layer 802 may be disposed between the top electrode and the bottom electrode of each memory cell 104a of the first set of memory cells 104a. A second active layer 802 may be disposed between the top electrode and the bottom electrode of each memory cell 104b of the second set of memory cells 104b. A third active layer 802 may be disposed between the top electrode and the bottom electrode of each memory cell 104b of the third set of memory cells 104c.

Compared with a traditional architecture, the memory cell arrangement 100 according to various aspects includes more active layers 802 per word line layer (that is a structured layer providing the word lines), and thus, provides a higher density of memory cells.

The operation of the memory cell arrangement 100 may be similar as described above. Applying the writing voltage to the selected memory cell may include applying the bit voltage $V_B$ and the word voltage $V_W$ to the control lines, to which the selected memory cell is connected, and applying the inhibit voltage $V_0$ to all other control lines of the memory cell arrangement 100.

It may be understood, that more than three sets of memory cells may be used, e.g. by stacking one or more set of memory cells on the second word lines 116 and further control line layer on each of the set of memory cells.

Figure 9:
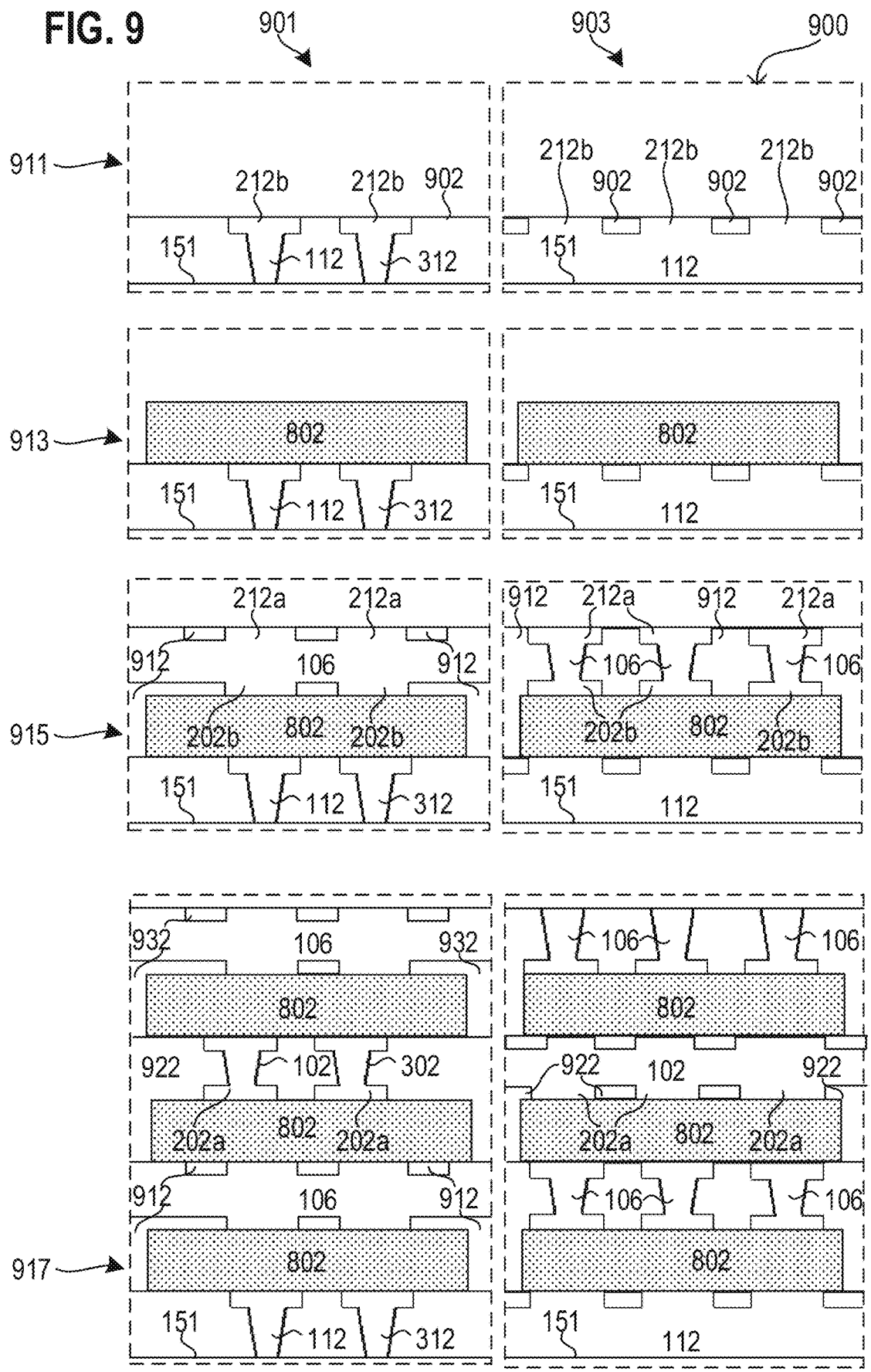
FIG. 9 schematically shows a method for forming a memory cell arrangement, according to various aspects, e.g. the memory cell arrangement of one of FIG. 1, FIG. 4 to FIG. 8, and FIG. 10.

FIG. 9 illustrates a method 900 for forming a memory cell arrangement 100 according to various aspects in a schematic cross-sectional views 901 and 903. Cross-sectional view 901 may be along a cross section 801 (e.g., along the 103, 105 plane). Cross-sectional view 903 may be along a cross section 803 (e.g., along the 101, 105 plane).

In the following, reference is made to various materials or layers, e.g. among others active materials/layers, dielectric materials/layers and electrically conductive materials/layers. It may be understood that the active material/layer has a degree of activity above the degree of activity (if present) of the other materials/layers, e.g. the dielectric materials/layers and electrically conductive materials/layers. Said otherwise, the dielectric material/layer and/or electrically conductive materials/layers may have a less degree of activity (also referred as being non-active) than the active material/layer. As examples, the degree of activity may be represented by the remanence (e.g., remanent polarization) or polarizability of the material/layer. For example, a less degree of activity may be represented by a less remanence. Thus, a non-active material/layer may be non-ferroelectric.

Further, reference may be made to the term "above" with regard to layers. Two layers formed above one another may be understood that one or more optional layers may be formed between the two layers and/or the two layers may be in physical contact to each other, that is, the two layers may be formed on another.

The method 900 may include, in 911, forming a plurality of first control lines 112, 312 (e.g., including of formed from an electrically conductive material). For example, the plurality of first control lines 112, 312 may be embedded in a first non-active (e.g., non-ferroelectric) dielectric layer 902 (e.g., including of formed from silicon oxide). In this case, forming the plurality of first control lines 112, 312 may include forming a plurality of trenches in the first dielectric layer 902, and filling the plurality of trenches with the electrically conductive material. For example, the electrically conductive material may include or be formed from titanium nitride.

Optionally, the method 900 may include, in 911, forming a plurality of first electrodes (also referred to as second bottom electrode 212b), e.g. over or from each control line 121, 312 of the plurality of first control lines 112, 312. The plurality of first electrodes may be electrically connected to each other by the control line 121, 312.

The method 900 may include, in 913, forming a first active layer 802 (e.g., including or formed from hafnium oxide) over the plurality of first control lines 112, 312 and (if present) over the second bottom electrodes 212b. The first active layer 802, e.g. the hafnium oxide thereof, may optionally be doped and/or annealed. This enhances the properties of the first active layer 802.

Forming the first active layer 802 may optionally include, pattering the first active layer 802. Pattering the first active layer 802 may include removing one or more portions from the first active layer 802, e.g. a perimeter portion of the active layer 802. Additionally or alternatively, pattering the first active layer 802 may expose one or more portions of the first dielectric layer 902.

The method 900 may include, in 915, forming a plurality of word lines 106 (e.g., including of formed from an electrically conductive material) above the first active layer 802. For example, the plurality of word lines 102 may be embedded in a second non-active (e.g., non-ferroelectric) dielectric layer 912 (e.g., including of formed from silicon oxide). In this case, forming the plurality of word lines 106 may include forming the second dielectric layer 912 over the first active layer 802. If the first active layer 802 is patterned, the second dielectric layer 912 may also cover a side face of the first active layer 802, e.g. a perimeter of the first active layer 802, and/or physically contact the first dielectric layer 902. Forming the plurality of word lines 106 may further include forming a plurality of trenches in the second dielectric layer 912, and filling the plurality of trenches with the electrically conductive material. The electrically conductive material may include or be formed from titanium nitride.

Optionally, the method 900 may include, in 911, forming a plurality of second electrodes (also referred to as second top electrodes 202b) under or from each word line of the plurality of word lines 106 and/or on the first active layer 802. The plurality of second top electrodes 202b may be electrically connected to each other by the word line 106.

Optionally, the method 900 may include, in 911, forming a plurality of third electrodes 212a (also referred to as first bottom electrode 212a) over or from each word line of the plurality of word lines 106. The plurality of first bottom electrode 212a may be electrically connected to each other by the word line 106.

The method 900 may include, in 917, forming a second active layer 802 (e.g., including or formed from hafnium oxide) over the plurality of word lines 106 and (if present) over the plurality of first bottom electrode 212a, e.g. similar to forming the first active layer 802. The second active layer 802, e.g. the hafnium oxide thereof, may optionally be doped and/or annealed. This enhances the properties of the second active layer 802.

The method 900 may include, in 917, forming a plurality of second control lines 102, 302 (e.g., including of formed from an electrically conductive material). For example, the plurality of second control lines 102, 302 may be embedded in a third non-active (e.g., non-ferroelectric) dielectric layer 922 (e.g., including of formed from silicon oxide). In this case, forming the plurality of second control lines 102, 302 may include forming a plurality of trenches in the third dielectric layer 922, and filling the plurality of trenches with the electrically conductive material. The electrically conductive material may include or be formed from titanium nitride.

Optionally, a third active layer 802 and further word lines 106 may be formed over the third dielectric layer 922.

Analogously, the further word lines 106 may be embedded in a fourth non-active (e.g., non-ferroelectric) dielectric layer 932.

Forming each electrode as detailed above may include disposing and/or removing material. For example, forming each electrode may include embedding non-active (e.g., non-ferroelectric) dielectric material in the exposed control line, e.g. by recessing each control line and filling the recesses with the non-active (e.g., non-ferroelectric) dielectric material. Additionally or alternatively, forming each electrodes may include adding electrically conductive material on each control line.

FIG. 10 illustrates the memory cell arrangement 100 according to various aspects 1000 in a schematic cross-sectional view 901, e.g. relating to method 900.

One or more memory cells 104a 104b of the memory structure 200 may include a recessed electrode (that is, the electrode includes a first recess) and/or a recessed active portion 204a, 204b (that is, the active portion includes a second recess). This increases the switching current (illustratively, due to a larger contact area and/or capacity) and thus, reduces the signal to noise ratio of the memory cell arrangement 100. Each recess (e.g., the first recess and/or second recess) may provide a cavity extending into the recessed object, e.g. the electrode or active portion, respectively.

For example, one or more first bottom electrodes 212a and/or one or more second bottom electrodes 212b of the memory structure 200 may be recessed (that is, may include the first recess). For example, the first recess may be surrounded by side walls of the recessed bottom electrode. The active material of the or each memory cell 104a 104b may extend into the recessed bottom electrode (e.g., into first recess), e.g. lining the recessed bottom electrode. For example, the active material may follow the contour of the first recess.

Optionally, disposing the active material over the recessed bottom electrode may include forming the active layer 802. The active layer 802 may but does not need to be patterned to separate the active portions from each other. When the active layer 802 is not patterned to separate the active portions from each other, the active portions of the memory cells may be connected to each other by active material.

For example, one or more first active portions 204a and/or one or more second active portions 204b of the memory structure 200 may be recessed (that is, may include the second recess). For example, the second recess of a recessed active portion may be surrounded by side walls of the recessed active portion. The top electrode contacting the active portion of the respective memory cell 104a 104b may extend into the recessed active portion (e.g., into second recess), e.g. lining or filling the recessed active portion.

Figure 11A:
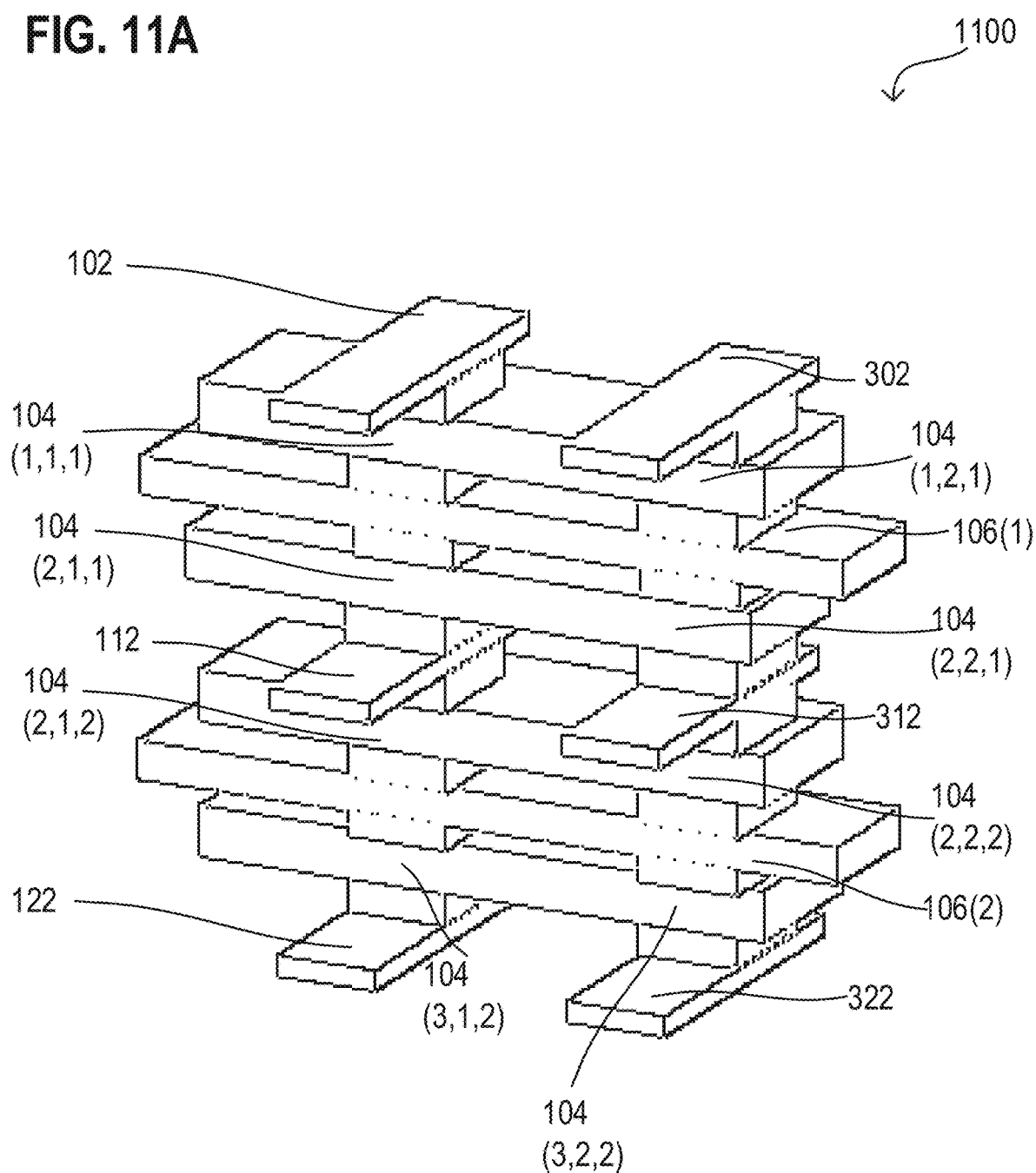
FIG. 11A shows a perspective view of an exemplary memory cell arrangement, according to various aspects.

FIG. 11A shows a perspective view of an exemplary memory cell arrangement 1100, according to various aspects. FIG. 11B schematically shows a schematic circuit layout of the exemplary memory cell arrangement 1100, according to various aspects.

The memory cell arrangement 1100 may include at least a first memory cell 104(1,1,1), a second memory cell 104(1,2,1), a third memory cell 104(2,1,1), a fourth memory cell 104(2,2,1), a fifth memory cell 104(2,1,2), a sixth memory cell 104(2,2,2), a seventh memory cell 104(3,1,2), and an eighth memory cell 104(3,2,2).

The memory cell arrangement 1100 may include a first common bitline 1102(1). The first common bitline 1102(1) may be assigned to the first memory cell 104(1,1,1) and the second memory cell 104(1,2,1). The memory cell arrangement 1100 may include a second common bitline 1102(2). The second common bitline 1102(2) may be assigned to the third memory cell 104(2,1,1), the fourth memory cell 104 (2,2,1), the fifth memory cell 104(2,1,2), and the sixth memory cell 104(2,2,2). The memory cell arrangement 1100 may include a third common bitline 1102(3). The third common bitline 1102(3) may be assigned to the seventh memory cell 104(3,1,2) and the eighth memory cell 104(3, 2,2).

The memory cell arrangement 1100 may include a first wordline 1104(1). The first wordline 1104(1) may be assigned to the first memory cell 104(1,1,1), the third memory cell 104(2,1,1), the fifth memory cell 104(2,1,2), and the seventh memory cell 104(3,1,2). The memory cell arrangement 1100 may include a second wordline 1104(2). The second wordline 1104(2) may be assigned to the second memory cell 104(1,2,1), the fourth memory cell 104(2,2,1), the sixth memory cell 104(2,2,2), and the eighth memory cell 104(3,2,2).

The memory cell arrangement 1100 may include a first plateline 106(1). The first plateline 106(1) may be assigned to the first memory cell 104(1,1,1), the second memory cell 104(1,2,1), the third memory cell 104(2,1,1), and the fourth memory cell 104(2,2,1). The memory cell arrangement 1100 may include a second plateline 106(2). The second plateline 106(2) may be assigned to the fifth memory cell 104(2,1,2), the sixth memory cell 104(2,2,2), the seventh memory cell 104(3,1,2), and the eighth memory cell 104(3,2,2). Each of the first plateline 106(1) and the second plateline 106(2) may be configured as third control line 106.

According to various aspects, the first plateline 106(1) may be connected (e.g., electrically conductively connected) to the first memory cell 104(1,1,1), the second memory cell 104(1,2,1), the third memory cell 104(2,1,1), and the fourth memory cell 104(2,2,1). The second plateline 106(2) may be connected (e.g., electrically conductively connected) to the fifth memory cell 104(2,1,2), the sixth memory cell 104(2, 2,2), the seventh memory cell 104(3,1,2), and the eighth memory cell 104(3,2,2).

Two or more of the memory cells (the first memory cell 104(1,1,1), the second memory cell 104(1,2,1), the third memory cell 104(2,1,1), the fourth memory cell 104(2,2,1), the fifth memory cell 104(2,1,2), the sixth memory cell 104(2,2,2), the seventh memory cell 104(3,1,2), and/or the eighth memory cell 104(3,2,2)) may be configured as or may be part of a respective memory structure 200. For example, the first memory cell 104(1,1,1) and the third memory cell 104(2,1,1) may form a memory cell pair. For example, the second memory cell 104(1,2,1) and the fourth memory cell 104(2,2,1) may form a memory cell pair. For example, the fifth memory cell 104(2,1,2) and the seventh memory cell 104(3,1,2) may form a memory cell pair. For example, the sixth memory cell 104(2,2,2) and the eighth memory cell 104(3,2,2) may form a memory cell pair.

The memory cell arrangement 1100 may include a first access device 110(1,1). The first access device 110(1,1) may be configured to connect the first common bitline 1102(1) to the first memory cell 104(1,1,1) controlled by a voltage applied at the first wordline 1104(1). The memory cell arrangement 1100 may include a second access device 110(1,2). The second access device 110(1,2) may be configured to connect the first common bitline 1102(1) to the second memory cell 104(1,2,1) controlled by a voltage applied at the second wordline 1104(2). The memory cell arrangement 1100 may include a third access device 110(2, 1). The third access device 110(2,1) may be configured to connect the second common bitline 1102(2) to the third memory cell 104(2,1,1) and the fifth memory cell 104(2,1,2) controlled by a voltage applied at the first wordline 1104(1). The memory cell arrangement 1100 may include a fourth access device 110(2,2). The fourth access device 110(2,2) may be configured to connect the second common bitline 1102(2) to the fifth memory cell 104(2,1,2) and the sixth memory cell 104(2,2,2) controlled by a voltage applied at the second wordline 1104(2). The memory cell arrangement 1100 may include a fifth access device 110(3,1). The fifth access device 110(3,1) may be configured to connect the third common bitline 1102(3) to the seventh memory cell 104(3,1,2) controlled by a voltage applied at the first wordline 1104(1). The memory cell arrangement 1100 may include a sixth access device 110(3,2). The sixth access device 110(3,2) may be configured to connect the third common bitline 1102(3) to the eighth memory cell 104(3, 2,2) controlled by a voltage applied at the second wordline 1104(2).

According to various aspects, a memory cell may be addressed via the corresponding access device. Each access device (the first access device, the second access device, the third access device, the fourth access device, the fifth access device, and/or the sixth access device) may include or may be, for example, a field effect transistor (FET), such as an n-type or p-type field-effect transistor, a transmission gate, such as an n-type-based or p-type-based transmission gate, or the like. Each access device may have a threshold voltage associated therewith. A threshold voltage of an access device (e.g., a field-effect transistor) may be defined by the properties of the access device (e.g., the field-effect transistor), such as the material(s), the doping(s), etc., and it may thus be a (e.g., intrinsic) property of the access device.

The memory cell arrangement 1100 may include a first sourceline 102. The first sourceline 102 may connect (e.g., electrically conductively connect) the first memory cell 104(1,1,1) with the first access device 110(1,1). According to various aspects, the first sourceline 102 may be configured as a first control line 102 of the plurality of first control lines 102, 302, 402.

The memory cell arrangement 1100 may include a second sourceline 302. The second sourceline 302 may connect the second memory cell 104(1,2,1) with the second access device 110(1,2). According to various aspects, the second sourceline 302 may be configured as a first control line 302 of the plurality of first control lines 102, 302, 402.

The memory cell arrangement 1100 may include a third sourceline 112. The third sourceline 112 may connect the third memory cell 104(2,1,1) and the fifth memory cell 104(2,1,2) with the third access device 110(2,1). According to various aspects, the third sourceline 112 may be configured as a second control line 112 of the plurality of second control lines 112, 312, 412.

The memory cell arrangement 1100 may include a fourth sourceline 312. The fourth sourceline 312 may connect the fifth memory cell 104(2,1,2) and the sixth memory cell 104(2,2,2) with the fourth access device 110(2,2). According to various aspects, the fourth sourceline 312 may be configured as a second control line 312 of the plurality of second control lines 112, 312, 412.

The memory cell arrangement 1100 may include a fifth sourceline 122. The fifth sourceline 122 may connect the seventh memory cell 104(3,1,2) with the fifth access device 110(3,1). According to various aspects, the fifth sourceline 122 may be correspond substantially to a first control line of the plurality of first control lines 102, 302, 402 and/or to a second control line of the plurality of second control lines 112, 312, 412.

The memory cell arrangement 1100 may include a sixth sourceline 322. The sixth sourceline 322 may connect the eighth memory cell 104(3,2,2) with the sixth access device 110(3,2). According to various aspects, the sixth sourceline 322 may be correspond substantially to a first control line of the plurality of first control lines 102, 302, 402 and/or to a second control line of the plurality of second control lines 112, 312, 412.

It is noted, that the above used terms "bitline", "wordline", "plateline", and "sourceline" are used to distinguish the lines from one another and each bitline, wordline, plateline, and/or sourceline may also be any other kind of control line.

In the following, various examples are provided that may include one or more aspects described above with reference to the memory cell arrangement 100, the memory structure 200, the memory cell arrangement 1100, and the method 900. It may be intended that aspects described in relation to the memory arrangement 100, the memory arrangement 1100, and/or the memory structure 200 may apply also to the method 900, and vice versa.

Example 1 is a memory cell arrangement, including: a first control line and a second control line; a plurality of memory structures disposed between the first control line and the second control line, wherein each memory structure of the plurality of memory structures includes a third control line, a first memory cell and a second memory cell; wherein, for each memory structure of the plurality of memory structures, the first memory cell and the second memory cell are coupled to each other by the third control line; wherein, for each memory structure of the plurality of memory structures, the first memory cell is coupled to the first control line and the second memory cell is coupled to the second control line.

Example 2 is the memory cell arrangement of example 1, wherein, for each memory structure of the plurality of memory structures, the first memory cell and a second memory cell form a first pair of memory cells, wherein each memory structure of the plurality of memory structures includes one or more than one second pair of memory cells, of which each second pair of memory cells includes a first memory cell and a second memory cell.

Example 3 is the memory cell arrangement of example 2, wherein, for each memory structure of the plurality of memory structures, the first memory cell and the second memory cell of each second pair of memory cells are coupled to each other by the third control line of the memory structure.

Example 4 is the memory cell arrangement of example 2 or 3, wherein, for each memory structure of the plurality of memory structures, the first memory cell of each second pair of memory cells is coupled to a further first control line, and the second memory cell of each second pair of memory cells is coupled to a further second control line.

Example 5 is the memory cell arrangement of example 4, wherein the plurality of memory structures is disposed between the further first control line and the further second control line.

Example 6 is the memory cell arrangement of example 1 or 5, further including: a substrate; wherein the second control line is disposed between the first control line and the substrate and/or wherein the second control line is disposed between the plurality of memory structures and the substrate; and/or wherein the second memory cell is disposed between the first memory cell and the substrate.

Example 7 is the memory cell arrangement of example 6, wherein the first control line and/or the second control line extend parallel to a surface of the substrate and/or wherein, for each memory structure of the plurality of memory structures, the third control line extends parallel to the surface of the substrate.

Example 8 is the memory cell arrangement of example 1 or 7, wherein the first control line and/or the second control line extend into a first direction; and wherein, for each memory structure of the plurality of memory structures, the third control line extends into a second direction differing (e.g., perpendicular to) from the first direction.

Example 9 is the memory cell arrangement of one of examples 1 to 8, further including a layer stack; wherein a first layer of the layer stack is structured to provide the first control line; wherein a second structured layer of the layer stack is structured to provide the second control line; and wherein a third structured layer of the layer stack is structured to provide the third control line of each memory structure of the plurality of memory structures; wherein the third layer is disposed between the first layer and the second layer.

Example 10 is the memory cell arrangement of one of examples 1 to 9, wherein, for each memory structure of the plurality of memory structures: the first memory cell includes a first electrode (e.g., coupled to the first control line or provided by a portion of the first control line) and a second electrode (e.g., coupled to third control line or provided by a portion of the third control line); and/or the second memory cell includes a first electrode (e.g., coupled to third control line or provided by the portion of the third control line) and a second electrode (e.g., coupled to the second control line or provided by a portion of the second control line).

Example 11 is the memory cell arrangement of example 10, wherein an active portion is disposed between the first electrode and the second electrode (e.g., of the first memory cell and/or of the second memory cell); and/or wherein the active portion extends (e.g., protrudes) into a recess of the first electrode and/or a recess of the second electrode (e.g., of the first memory cell and/or of the second memory cell).

Example 12 is the memory cell arrangement of one of examples 10 to 11, wherein the first electrode extends (e.g., protrudes) into a recess of the second electrode (e.g., of the first memory cell and/or of the second memory cell) and/or a recess of the active portion; or wherein the second electrode extends (e.g., protrudes) into a recess of the first electrode (e.g., of the first memory cell and/or of the second memory cell) and/or a recess of the active portion.

Example 13 is the memory cell arrangement of one of examples 1 to 12, wherein each memory structure of the plurality of memory structures includes four or more memory cells coupled to the third control line (e.g., coupled to each other by the third control line).

Example 14 is the memory cell arrangement of one of examples 1 to 13, further including: a write control circuit configured to control a first voltage at the first control line, a second voltage at the second control line and/or a third voltage at the third control line.

Example 15 is the memory cell arrangement of example 14, wherein the write control circuit is configured to select a memory structure of the plurality of memory structures and to perform a writing operation of the selected memory structure by controlling the first voltage the second voltage and/or the third voltage, wherein, optionally, the writing operation changes at least one memory state of the selected memory structure.

Example 16 is the memory cell arrangement of example 15, wherein the writing operation of the selected memory structure includes writing (e.g., to programming and/or erasing) either the first memory cell of the selected memory structure or the second memory cell of the selected memory structure, wherein optionally, writing the first memory cell changes a memory state of the first memory cell and/or writing the second memory cell changes a memory state of the second memory cell.

Example 17 is the memory cell arrangement of example 16, wherein, writing the first memory cell includes that the third voltage differs more from the first voltage than from the second voltage, wherein, for example, the difference between the third voltage and the first voltage is greater than a programming voltage of the first memory cell; wherein, for example, the difference between the third voltage and the second voltage is less than the programming voltage of the first memory cell;

Example 18 is the memory cell arrangement of one of example 16 or 17, wherein writing the second memory cell includes that the third voltage differs more from the second voltage than from the first voltage; wherein, for example, the difference between the third voltage and the second voltage is greater than a programming voltage of the second memory cell; wherein, for example, the difference between the third voltage and the first voltage is less than the programming voltage of the second memory cell.

Example 19 is the memory cell arrangement of one of examples 1 to 18, wherein each memory cell (e.g., the first memory cell and/or the second memory cell) of one or more memory structures of the plurality of memory structures is configured to switch between a first memory state and a second memory state, when the programming voltage or more is applied to the memory cell.

Example 20 is a memory structure (e.g., providing one or more memory structures of the memory cell arrangement of one of examples 1 to 19), including: a first top electrode, a first bottom electrode and a first active (e.g., ferroelectric) portion disposed between first top electrode and the first bottom electrode; a second top electrode, a second bottom electrode and a second active (e.g., ferroelectric) portion disposed between second top electrode and the second bottom electrode; wherein the first bottom electrode and the second top electrode are disposed between the first active portion and the second active portion and are coupled to each other by a control line portion; wherein optionally, the second active portion is disposed between the first active portion and a substrate carrying the memory structure.

Example 21 is the memory structure of example 20, wherein the first active portion extends (e.g., protrudes) into a recess of the first top electrode and/or a recess of the first bottom electrode; and/or wherein the second active portion extends (e.g., protrudes) into a recess of the second top electrode and/or a recess of the second bottom electrode.

Example 22 is the memory structure of example 20 or 21, wherein the first top electrode extends (e.g., protrudes) into a recess of the first bottom electrode and/or a recess of the first active portion; and/or wherein the first bottom electrode extends (e.g., protrudes) into a recess of the first top electrode and/or a recess of the first active portion.

Example 23 is the memory structure of one of examples 20 to 22, wherein the second top electrode extends (e.g., protrudes) into a recess of the second bottom electrode and/or a recess of the second active portion; and/or wherein the second bottom electrode extends (e.g., protrudes) into a recess of the second top electrode and/or a recess of the second active portion.

Example 24 is the memory structure of one of examples 20 to 23, wherein the first bottom electrode and/or the first active portion are recessed; and/or wherein the second bottom electrode and/or the second active portion are recessed.

Example 25 is the memory structure of example 24, wherein the first top electrode extends into the recessed first bottom electrode and/or the recessed first active portion; and/or wherein the second top electrode extends into the recessed second bottom electrode and/or the recessed second active portion.

Example 26 is a memory cell arrangement, including: a set of first control lines (e.g., provided by a first structured layer) and a set of second control lines (e.g., provided by a second structured layer); a third control line (e.g., provided by a third structured layer) disposed between the set of first control line and the set of second control lines; a first set of memory cells, wherein each memory cell of the first set of memory cells is addressable by the set of first control lines and the third control line; a second set of memory cells, wherein each memory cell of the second set of memory cells is addressable by the set of second control lines and the third control line; a substrate, wherein the second set of memory cells is disposed between the first set of memory cells and the substrate.

Example 27 is the memory cell arrangement of example 26, wherein the first set of memory cells is disposed between the third control line and the set of first control lines; wherein the second set of memory cells is disposed between the third control line and the set of second control lines.

Example 28 is a memory cell (e.g., providing one or more memory cells of one of examples 1 to 27), including: a two electrodes, and an active (e.g., ferroelectric) portion disposed between the two electrodes; wherein an electrode (e.g., a top electrode or a bottom electrode) of the two electrodes includes a recess; wherein another electrode of the two electrodes and/or the active portion protrudes into the recess.

In Example 29, each memory cell (e.g., the first memory cell and/or the second memory cell) of one of examples 1 to 28 is a non-volatile ferroelectric memory cell (e.g., a ferroelectric random access memory (FeRAM) cell).

In Example 30, each memory cell (e.g., the first memory cell and/or the second memory cell) of one of examples 1 to 29 is connected to one bit line (e.g., provided by a first control line or by a second control line) an to one word line (e.g., provided by a third control line).

In Example 31, each first control line of one of examples 1 to 30 is provided by a first structured layer disposed over each memory cell (e.g., the first memory cell and/or the second memory cell).

In Example 32, each second control line of one of examples 1 to 31 is provided by a second structured layer disposed under each memory cell (e.g., the first memory cell and/or the second memory cell) and/or between a substrate and each memory cell.

In Example 33, each third control line of one of examples 1 to 32 is provided by a third structured layer disposed between the first memory cell(s) and the second memory cell(s).

In Example 34, each memory cell (e.g., the first memory cell and/or the second memory cell) of one of examples 1 to 33 includes a ferroelectric capacitor.

In Example 35, a pair of memory cells (e.g., including the first memory cell and the second memory cell) of one of examples 1 to 34 shares a third control line disposed between the pair of memory cells.

In Example 36, each memory cell (e.g., the first memory cell and/or the second memory cell) of one of examples 1 to 35 includes a electrode coupled to either the first control line or the second control line and another electrode coupled to the third control line.

In Example 37, an active portion (e.g., ferroelectric portion) of each memory cell of one of examples 1 to 36 includes or is formed from a ferroelectric material.

In Example 38, the ferroelectric material of example 37 includes or is formed from ferroelectric hafnium oxide.

In Example 39, the active portion of example 37 or 38 is or includes a remanent-polarizable material, optionally the remanent-polarizable material includes a first polarization state (e.g., providing a first memory state) with a first residual polarization and a second polarization state (e.g., providing a second memory state) with a second residual polarization.

In Example 40, the remanent-polarizable material of example 39 has an absolute value of a first residual polarization associated with the first polarization state that is substantially equal to an absolute value of a second residual polarization associated with the second polarization state.

In Example 41, each memory cell of one of examples 1 to 40 is connected to a write control circuit configured to write (e.g., to program and/or erase) one or more of the memory cells.

Example 42 is a memory cell arrangement that may include: a first memory cell, a second memory cell, a third memory cell, a fourth memory cell, a fifth memory cell, a sixth memory cell, a seventh memory cell, and an eighth memory cell; a first common bitline assigned to the first memory cell, and the second memory cell; a second common bitline assigned to the third memory cell, the fourth memory cell, the fifth memory cell, and the sixth memory cell; a third common bitline assigned to the seventh memory cell and the eighth memory cell; a first wordline assigned to the first memory cell, the third memory cell, the fifth memory cell, and the seventh memory cell; a second wordline assigned to the second memory cell, the fourth memory cell, the sixth memory cell, and the eighth memory cell; a first plateline assigned to the first memory cell, the second memory cell, the third memory cell, and the fourth memory cell; a second plateline assigned to the fifth memory cell, the sixth memory cell, the seventh memory cell, and the eighth memory cell.

In Example 43 the memory cell arrangement of example 42 may optionally further include: a first access device configured to connect the first common bitline to the first memory cell controlled by a voltage applied at the first wordline; a second access device configured to connect the first common bitline to the second memory cell controlled by a voltage applied at the second wordline; a third access device configured to connect the second common bitline to the third memory cell and the fifth memory cell controlled by a voltage applied at the first wordline; a fourth access device configured to connect the second common bitline to the fifth memory cell and the sixth memory cell controlled by a voltage applied at the second wordline; a fifth access device configured to connect the third common bitline to the seventh memory cell controlled by a voltage applied at the first wordline; and a sixth access device configured to connect the third common bitline to the eighth memory cell controlled by a voltage applied at the second wordline.

In Example 44 the memory cell arrangement of example 43 may optionally further include: a first sourceline connecting the first memory cell with the first access device; a second sourceline connecting the second memory cell with the second access device; a third sourceline connecting the third memory cell and the fifth memory cell with the third access device; a fourth sourceline connecting the fifth memory cell and the sixth memory cell with the fourth access device; a fifth sourceline connecting the seventh memory cell with the fifth access device; and a sixth sourceline connecting the eighth memory cell with the sixth access device.

Example 45 is a memory cell arrangement that may include: a first control line and a second control line; a plurality of memory structures, wherein each memory structure of the plurality of memory structures includes a third control line, and a pair of memory cells disposed between the first control line and the second control line; wherein, for each memory structure of the plurality of memory structures: a first memory cell of the respective pair of memory cells and a second memory cell of the respective pair of memory cells are coupled to each other by the respective third control line, the first memory cell is coupled to the first control line, the second memory cell is coupled to the second control line, the first memory cell includes a first remanent-polarizable portion, and the second memory cell includes a second remanent-polarizable portion.

In Example 46 the memory cell arrangement of example 45 may optionally further include that each memory structure of the plurality of memory structures includes one or more second pairs of memory cells, of which each second pair of memory cells includes a third memory cell and a fourth memory cell; and that the third memory cell includes a third remanent-polarizable portion and the fourth memory cell includes a fourth remanent-polarizable portion.

In Example 47 the memory cell arrangement of example 46 may optionally further include that, for each memory structure of the plurality of memory structures, the first memory cell, the second memory cell, the third memory cell, and the fourth memory cell are coupled to each other by the respective third control line of the memory structure.

In Example 48 the memory cell arrangement of example 46 or 47 may optionally further include that, for each memory structure of the plurality of memory structures, the third memory cell is coupled to a further first control line, and that the fourth memory cell is coupled to a further second control line.

In Example 49 the memory cell arrangement of example 48 may optionally further include that the respective second pairs of memory cells are disposed between the further first control line and the further second control line.

In Example 50 the memory cell arrangement of any one of examples 45 to 49 may optionally further include that the first control line(s) and/or the second control line(s) extend into a first direction; and that, for each memory structure of the plurality of memory structures, the respective third control line extends into a second direction differing from the first direction.

In Example 51 the memory cell arrangement of any one of examples 45 to 50 may optionally further include that, for each memory structure of the plurality of memory structures: the first memory cell includes a first electrode coupled to the first control line or provided by a portion of the first control line and a second electrode coupled to the respective third control line or provided by a portion of the respective third control line; and the second memory cell includes a first electrode coupled to the respective third control line or provided by the portion of the respective third control line and a second electrode coupled to the second control line or provided by a portion of the second control line; and/or that, for each memory structure of the plurality of memory structures: the third memory cell includes a first electrode coupled to the further first control line or provided by a portion of the further first control line and a second electrode coupled to the respective third control line or provided by a portion of the respective third control line; and the fourth memory cell includes a first electrode coupled to the respective third control line or provided by the portion of the respective third control line and a second electrode coupled to the further second control line or provided by a portion of the further second control line.

In Example 52 the memory cell arrangement of any one of examples 45 to 51 may optionally further include: a fourth control line; a further plurality of memory structures, wherein each memory structure of the further plurality of memory structures includes a fifth control line, and a further pair of memory cells disposed between the second control line and the fourth control line; wherein, for each memory structure of the further plurality of memory structures: a fifth memory cell of the respective further pair of memory cells and a sixth memory cell of the respective further pair of memory cells are coupled to each other by the respective fifth control line, the fifth memory cell is coupled to the second control line, the sixth memory cell is coupled to the fourth control line, the fifth memory cell includes a fifth remanent-polarizable portion, and the sixth memory cell includes a sixth remanent-polarizable portion.

In Example 53 the memory cell arrangement of example 52 may optionally further include that each memory structure of the further plurality of memory structures includes one or more further second pairs of memory cells, of which each further second pair of memory cells includes a seventh memory cell and an eighth memory cell; and wherein the seventh memory cell includes a seventh remanent-polarizable portion and the eighth memory cell includes an eighth remanent-polarizable portion.

In Example 54 the memory cell arrangement of example 53 may optionally further include that, for each memory structure of the plurality of memory structures, the fifth memory cell, the sixth memory cell, the seventh memory cell, and the eighth memory cell are coupled to each other by the respective fifth control line of the memory structure.

In Example 55 the memory cell arrangement of example 53 or 54 may optionally further include that, for each memory structure of the further plurality of memory structures, the seventh memory cell is coupled to the further second control line, and that the eighth memory cell is coupled to a further fourth control line.

In Example 56 the memory cell arrangement of example 55 may optionally further include that the respective further second pairs of memory cells are disposed between the further second control line and the further fourth control line.

In Example 57 the memory cell arrangement of any one of examples 52 to 56 may optionally further include that the fourth control line(s) extend into a first direction; and that, for each memory structure of the further plurality of memory structures, the respective fifth control line extends into a second direction differing from the first direction.

In Example 58 the memory cell arrangement of any one of examples 52 to 57 may optionally further include that, for each memory structure of the further plurality of memory structures: the fifth memory cell includes a first electrode coupled to the second control line or provided by a portion of the second control line and a second electrode coupled to the respective fifth control line or provided by a portion of the respective fifth control line; and the sixth memory cell includes a first electrode coupled to the respective fifth control line or provided by the portion of the respective fifth control line and a second electrode coupled to the fourth control line or provided by a portion of the fourth control line; and/or that, for each memory structure of the further plurality of memory structures: the seventh memory cell includes a first electrode coupled to the further second control line or provided by a portion of the further second control line and a second electrode coupled to the fifth control line or provided by a portion of the respective fifth control line; and the eighth memory cell includes a first electrode coupled to the respective fifth control line or provided by the portion of the respective fifth control line and a second electrode coupled to the further fourth control line or provided by a portion of the further fourth control line.

In Example 59 the memory cell arrangement of any one of examples 52 to 58 may optionally further include: a first bitline; a second bitline; a third bitline; a wordline; a first access device configured to connect the first bitline to the first control line controlled by a voltage applied at the wordline; a second access device configured to connect the second bitline to the second control line controlled by a voltage applied at the wordline; a third access device configured to connect the third bitline to the fourth control line controlled by a voltage applied at the wordline.

Example 60 is a memory structure that may include: a first top electrode, a first bottom electrode and a first remanent-polarizable portion disposed between first top electrode and the first bottom electrode; a second top electrode, a second bottom electrode and a second remanent-polarizable portion disposed between second top electrode and the second bottom electrode; wherein the first bottom electrode and the second top electrode are disposed between the first remanent-polarizable portion and the second remanent-polarizable portion and are coupled to each other by a control line portion.

In Example 61 the memory structure of example 60 may optionally further include that the first remanent-polarizable portion protrudes into a recess of the first bottom electrode or first top electrode; and/or wherein second remanent-polarizable portion protrudes into a recess of the second bottom electrode or second top electrode.

In some aspects, a memory cell included in a memory structure or a memory cell arrangement (e.g., as described above with reference to examples 1 to 61) may be configured as a three-dimensional memory cell. As an example, at least the remanent-polarizable portion of the memory cell may have a curved shape or an angled shape. Illustratively, at least the remanent-polarizable portion of the memory cell may have a concave or convex shape. In some aspects, the electrodes (e.g., the bottom and/or top electrode of the memory cell) may (e.g., conformally) cover two opposite surfaces of the curved or angled remanent-polarizable portion. In some aspects, the electrode may have a similar shape or the same shape as the remanent-polarizable portion. In some aspects, the remanent-polarizable portion of the memory cell may be U-shaped or V-shaped. In some aspects, the top-electrode and/or the bottom electrode of the memory cell may be U-shaped or V-shaped.

In some aspects, memory cells included in a memory cell arrangement (e.g., as described above with reference to examples 1 to 61) may be configured such that two or more memory cells share a common remanent-polarizable layer that provides the two or more remanent-polarizable portions of the two or more memory cells. In some aspects, all memory cells that are addressed by the one or more first control lines and the corresponding third control lines may share a common remanent-polarizable layer (e.g., a first remanent-polarizable layer) that provides the respective remanent-polarizable portions of the memory cells. In some aspects, all memory cells that are addressed by the one or more second control lines and the corresponding third control lines may share a common remanent-polarizable layer (e.g., a second remanent-polarizable layer) that provides the respective remanent-polarizable portions of the memory cells.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. Memory cell arrangement, comprising:
a first control line and a second control line;
a continuous first memory layer and a continuous second memory layer;
a plurality of memory structures, wherein each memory structure of the plurality of memory structures comprises a third control line, and a pair of memory cells disposed between the first control line and the second control line;
wherein, for each memory structure of the plurality of memory structures:
a first memory cell of the respective pair of memory cells and a second memory cell of the respective pair of memory cells are coupled to each other by the respective third control line,
the first memory cell is coupled to the first control line,
the second memory cell is coupled to the second control line,
the first memory cell comprises a first remanent-polarizable portion and
the second memory cell comprises a second remanent-polarizable portion;
wherein the plurality of memory structures share the continuous first memory layer and the continuous second memory layer that provide respective first and second remanent-polarizable portions of the plurality of memory structures.

2. The memory cell arrangement of claim 1,
wherein the pair of memory cells is a first pair of memory cells;
wherein each memory structure of the plurality of memory structures comprises one or more second pairs of memory cells, of which each second pair of memory cells comprises a third memory cell and a fourth memory cell; and
wherein the third memory cell comprises a third remanent-polarizable portion and the fourth memory cell comprises a fourth remanent-polarizable portion.

3. The memory cell arrangement of claim 2,
wherein, for each memory structure of the plurality of memory structures, the first memory cell, the second memory cell, the third memory cell, and the fourth memory cell are coupled to each other by the respective third control line of the memory structure.

4. The memory cell arrangement of claim 2,
wherein, for each memory structure of the plurality of memory structures, the third memory cell is coupled to a further first control line, and wherein the fourth memory cell is coupled to a further second control line, and wherein the respective second pairs of memory cells are disposed between the further first control line and the further second control line.

5. The memory cell arrangement of claim 2,
wherein the first remanent-polarizable portion and the third remanent-polarizable portion are part of a common first remanent-polarizable layer; and
wherein the second remanent-polarizable portion and the fourth remanent-polarizable portion are part of a common first remanent-polarizable layer.

6. The memory cell arrangement of claim 1,
wherein the first control line and/or the second control line extends into a first direction; and
wherein, for each memory structure of the plurality of memory structures, the respective third control line extends into a second direction differing from the first direction.

7. The memory cell arrangement of claim 4,
wherein, for each memory structure of the plurality of memory structures:
the first memory cell comprises a first electrode coupled to the first control line or provided by a portion of the first control line and a second electrode coupled to the respective third control line or provided by a portion of the respective third control line; and
the second memory cell comprises a first electrode coupled to the respective third control line or provided by the portion of the respective third control line and a second electrode coupled to the second control line or provided by a portion of the second control line; and/or
wherein, for each memory structure of the plurality of memory structures:
the third memory cell comprises a first electrode coupled to the further first control line or provided by a portion of the further first control line and a second electrode coupled to the respective third control line or provided by a portion of the respective third control line; and
the fourth memory cell comprises a first electrode coupled to the respective third control line or provided by the portion of the respective third control line and a second electrode coupled to the further second control line or provided by a portion of the further second control line.

8. The memory cell arrangement of claim 7, further comprising:
a fourth control line;
a further plurality of memory structures, wherein each memory structure of the further plurality of memory structures comprises a fifth control line, and a further pair of memory cells disposed between the second control line and the fourth control line;
wherein, for each memory structure of the further plurality of memory structures:
a fifth memory cell of the respective further pair of memory cells and a sixth memory cell of the respective further pair of memory cells are coupled to each other by the respective fifth control line,
the fifth memory cell is coupled to the second control line,
the sixth memory cell is coupled to the fourth control line,
the fifth memory cell comprises a fifth remanent-polarizable portion, and
the sixth memory cell comprises a sixth remanent-polarizable portion.

9. The memory cell arrangement of claim 8,
wherein the pair of memory cells is a first pair of memory cells;
wherein each memory structure of the plurality of memory structures comprises one or more second pairs of memory cells, of which each second pair of memory cells comprises a third memory cell and a fourth memory cell;
wherein each memory structure of the further plurality of memory structures comprises one or more further second pairs of memory cells, of which each further second pair of memory cells comprises a seventh memory cell and an eighth memory cell; and
wherein the seventh memory cell comprises a seventh remanent-polarizable portion and the eighth memory cell comprises an eighth remanent-polarizable portion.

10. The memory cell arrangement of claim 9,
wherein, for each memory structure of the plurality of memory structures, the fifth memory cell, the sixth memory cell, the seventh memory cell, and the eighth memory cell are coupled to each other by the respective fifth control line of the memory structure.

11. The memory cell arrangement of claim 9,
wherein, for each memory structure of the further plurality of memory structures, the seventh memory cell is coupled to the further second control line, and wherein the eighth memory cell is coupled to a further fourth control line.

12. The memory cell arrangement of claim 11,
wherein the respective further second pairs of memory cells are disposed between the further second control line and the further fourth control line.

13. The memory cell arrangement of claim 8,
wherein the fourth control line extends into a first direction; and
wherein, for each memory structure of the further plurality of memory structures, the respective fifth control line extends into a second direction differing from the first direction.

14. The memory cell arrangement of claim 11,
wherein, for each memory structure of the further plurality of memory structures:
the fifth memory cell comprises a first electrode and a second electrode, wherein the first electrode is coupled to the second control line or provided by a portion of the second control line, and wherein the second electrode is coupled to the respective fifth control line or provided by a portion of the respective fifth control line; and
the sixth memory cell comprises a first electrode and a second electrode, wherein the first electrode is coupled to the respective fifth control line or provided by the portion of the respective fifth control line, and wherein the second electrode is coupled to the fourth control line or provided by a portion of the fourth control line; and/or
wherein, for each memory structure of the further plurality of memory structures:
the seventh memory cell comprises a first electrode and a second electrode, wherein the first electrode is coupled to the further second control line or provided by a portion of the further second control line, and wherein the second electrode is coupled to the fifth control line or provided by a portion of the respective fifth control line; and
the eighth memory cell comprises a first electrode and a second electrode, wherein the first electrode is coupled to the respective fifth control line or provided by the portion of the respective fifth control line, and wherein the second electrode is coupled to the further fourth control line or provided by a portion of the further fourth control line.

15. The memory cell arrangement of claim 8, further comprising:
a first bitline;
a second bitline;
a third bitline;
a wordline;
a first access device configured to connect the first bitline to the first control line controlled by a voltage applied at the wordline;
a second access device configured to connect the second bitline to the second control line controlled by a voltage applied at the wordline;
a third access device configured to connect the third bitline to the fourth control line controlled by a voltage applied at the wordline.

16. The memory cell arrangement of claim 1,
wherein a plurality of first remanent-polarizable portions of the plurality of memory structures are provided by respective portions of the continuous first memory layer and wherein a plurality of second remanent-polarizable portions of the plurality of memory structures are provided by respective portions of the second continuous memory layer.

17. Memory cell arrangement, comprising:
a first control line and a second control line;
a plurality of memory structures, wherein each memory structure of the plurality of memory structures comprises a third control line, and a pair of memory cells disposed between the first control line and the second control line;
wherein, for each memory structure of the plurality of memory structures:
a first memory cell of the respective pair of memory cells and a second memory cell of the respective pair of memory cells are coupled to each other by the respective third control line,
the first memory cell is coupled to the first control line,
the second memory cell is coupled to the second control line,
the first memory cell comprises a first remanent-polarizable portion, and
the second memory cell comprises a second remanent-polarizable portion,
wherein the first remanent-polarizable portion of the first memory cell of each memory structure of the plurality of memory structures is a portion of a continuous first active layer, and
wherein the second remanent-polarizable portion of the second memory cell of each memory structure of the plurality of memory structures is a portion of a continuous second active layer.

18. Memory cell arrangement according to claim 17,
wherein the continuous first active layer comprises a ferroelectric material and wherein the continuous second active layer comprises a ferroelectric material.

19. Memory cell arrangement according to claim 1,
wherein the continuous first memory layer comprises a ferroelectric material and wherein the continuous second memory layer comprises a ferroelectric material.

20. Memory cell arrangement according to claim 19,
wherein the memory portions of each first memory cell of the plurality of memory structures are connected to one another by the ferroelectric material of the continuous first memory layer; and
wherein the memory portions of each second memory cell of the plurality of memory structures are connected to one another by the ferroelectric material of the continuous second memory layer.

* * * * *